(12) United States Patent
Gross et al.

(10) Patent No.: US 11,886,053 B2
(45) Date of Patent: Jan. 30, 2024

(54) METHODS OF AND SYSTEMS FOR PROCESSING USING ADJUSTABLE BEAM CHARACTERISTICS

(71) Applicant: NLIGHT, INC., Camas, WA (US)

(72) Inventors: Ken Gross, Vancouver, WA (US); Brian Victor, Camas, WA (US); Robert J. Martinsen, Portland, OR (US); Dahv A. V. Kliner, Portland, OR (US); Roger Farrow, Vancouver, WA (US)

(73) Assignee: NLIGHT, INC., Camas, WA (US)

( * ) Notice: Subject to any disclaimer, the term of this patent is extended or adjusted under 35 U.S.C. 154(b) by 0 days.

(21) Appl. No.: 17/854,933

(22) Filed: Jun. 30, 2022

(65) Prior Publication Data

US 2022/0404648 A1 Dec. 22, 2022

Related U.S. Application Data

(63) Continuation of application No. 17/127,746, filed on Dec. 18, 2020, now abandoned, which is a
(Continued)

(51) Int. Cl.
  *G02F 1/01* (2006.01)
  *B23K 26/067* (2006.01)
  (Continued)

(52) U.S. Cl.
  CPC .......... *G02F 1/0115* (2013.01); *B22F 3/1109* (2013.01); *B22F 3/24* (2013.01);
  (Continued)

(58) Field of Classification Search
  CPC .................................................. G02F 1/0115
  See application file for complete search history.

(56) References Cited

U.S. PATENT DOCUMENTS 4,698,480 A   10/1987 Klingel
4,770,492 A    9/1988 Levin et al.
(Continued)

FOREIGN PATENT DOCUMENTS

CN       103293594     6/2013
EP        0798067 A    1/1997
(Continued)

OTHER PUBLICATIONS

Betty Lise Anderson and Zheng Qi, "On the Use of Microbend Fiber Optic Mode Strippers and Scramblers: Cautionary Note," Appl. Opt. 34, 8082-8083 ) (Year: 2995).*

(Continued)

*Primary Examiner* — Peter Radkowski
(74) *Attorney, Agent, or Firm* — Schwabe Williamson & Wyatt

(57) ABSTRACT

A method of processing by controlling one or more beam characteristics of an optical beam may include: launching the optical beam into a first length of fiber having a first refractive-index profile (RIP); coupling the optical beam from the first length of fiber into a second length of fiber having a second RIP and one or more confinement regions; modifying the one or more beam characteristics of the optical beam in the first length of fiber, in the second length of fiber, or in the first and second lengths of fiber; confining the modified one or more beam characteristics of the optical beam within the one or more confinement regions of the second length of fiber; and/or generating an output beam, having the modified one or more beam characteristics of the optical beam, from the second length of fiber. The first RIP may differ from the second RIP.

18 Claims, 21 Drawing Sheets

Related U.S. Application Data continuation of application No. 15/883,480, filed on Jan. 30, 2018, now Pat. No. 10,877,220, which is a continuation-in-part of application No. PCT/US2017/034848, filed on May 26, 2017, said application No. 15/883,480 is a continuation-in-part of application No. 15/607,399, filed on May 26, 2017, now Pat. No. 10,423,015, said application No. 15/883,480 is a continuation-in-part of application No. 15/607,410, filed on May 26, 2017, now Pat. No. 10,663,767, said application No. 15/883,480 is a continuation-in-part of application No. 15/607,411, filed on May 26, 2017, now Pat. No. 10,295,845.

(60) Provisional application No. 62/401,650, filed on Sep. 29, 2016.

(51) Int. Cl.

| | | |
|---|---|---|
| B23K 26/38 | (2014.01) | |
| G02B 6/14 | (2006.01) | |
| B23K 26/21 | (2014.01) | |
| B22F 3/11 | (2006.01) | |
| B22F 3/24 | (2006.01) | |
| B23K 26/03 | (2006.01) | |
| G02B 6/02 | (2006.01) | |
| B33Y 10/00 | (2015.01) | |
| B33Y 30/00 | (2015.01) | |
| B33Y 50/02 | (2015.01) | |
| B23K 26/342 | (2014.01) | |
| B29C 48/08 | (2019.01) | |
| G02B 6/036 | (2006.01) | |
| G02B 6/42 | (2006.01) | |
| B23K 26/062 | (2014.01) | |
| B23K 26/70 | (2014.01) | |
| B29C 64/264 | (2017.01) | |
| B29C 64/153 | (2017.01) | |
| H01S 5/00 | (2006.01) | |
| B22F 10/20 | (2021.01) | |
| B22F 10/31 | (2021.01) | |
| B22F 10/36 | (2021.01) | |
| B23K 26/064 | (2014.01) | |
| B23K 26/073 | (2006.01) | |
| G02B 6/255 | (2006.01) | |
| G02B 27/09 | (2006.01) | |
| G02B 26/10 | (2006.01) | |
| G02B 6/028 | (2006.01) | |
| G02F 1/015 | (2006.01) | |
| B22F 12/44 | (2021.01) | |
| B22F 12/49 | (2021.01) | |
| G02B 6/26 | (2006.01) | |
| G02B 6/12 | (2006.01) | |

(52) U.S. Cl.
CPC ............ *B22F 10/20* (2021.01); *B22F 10/31* (2021.01); *B22F 10/36* (2021.01); *B23K 26/032* (2013.01); *B23K 26/034* (2013.01); *B23K 26/0342* (2015.10); *B23K 26/062* (2015.10); *B23K 26/064* (2015.10); *B23K 26/067* (2013.01); *B23K 26/073* (2013.01); *B23K 26/21* (2015.10); *B23K 26/342* (2015.10); *B23K 26/38* (2013.01); *B23K 26/704* (2015.10); *B29C 48/08* (2019.02); *B29C 64/153* (2017.08); *B29C 64/264* (2017.08); *B33Y 10/00* (2014.12); *B33Y 30/00* (2014.12); *B33Y 50/02* (2014.12); *G02B 6/02* (2013.01); *G02B 6/021* (2013.01); *G02B 6/023* (2013.01); *G02B 6/02042* (2013.01); *G02B 6/02347* (2013.01); *G02B 6/02371* (2013.01); *G02B 6/02395* (2013.01); *G02B 6/036* (2013.01); *G02B 6/03611* (2013.01); *G02B 6/03694* (2013.01); *G02B 6/14* (2013.01); *G02B 6/255* (2013.01); *G02B 6/4203* (2013.01); *G02B 6/4206* (2013.01); *G02B 27/0927* (2013.01); *G02B 27/0933* (2013.01); *G02B 27/0994* (2013.01); *H01S 5/0085* (2013.01); *B22F 12/44* (2021.01); *B22F 12/49* (2021.01); *G02B 6/02004* (2013.01); *G02B 6/0281* (2013.01); *G02B 6/0288* (2013.01); *G02B 6/0365* (2013.01); *G02B 6/03616* (2013.01); *G02B 6/03627* (2013.01); *G02B 6/03633* (2013.01); *G02B 6/03638* (2013.01); *G02B 6/03688* (2013.01); *G02B 6/262* (2013.01); *G02B 6/4296* (2013.01); *G02B 26/101* (2013.01); *G02B 2006/12121* (2013.01); *G02F 1/0151* (2021.01)

(56) References Cited

U.S. PATENT DOCUMENTS

| | | | | |
|---|---|---|---|---|
| 6,304,704 | B1 * | 10/2001 | Kalish | G02B 6/14 |
| | | | | 385/128 |
| 6,621,044 | B2 * | 9/2003 | Jain | G03F 7/70216 |
| | | | | 250/492.1 |
| 6,947,802 | B2 * | 9/2005 | Picard | B23K 26/032 |
| | | | | 700/170 |
| 7,215,858 | B2 | 5/2007 | Po | |
| 8,781,269 | B2 * | 7/2014 | Huber | B23K 26/064 |
| | | | | 385/18 |
| 9,250,390 | B2 * | 2/2016 | Muendel | G02B 6/4216 |
| 9,339,890 | B2 * | 5/2016 | Woods | B23K 26/36 |
| 9,636,775 | B2 * | 5/2017 | Huang | B28B 17/0063 |
| 2002/0130279 | A1 * | 9/2002 | Jain | G03F 7/70358 |
| | | | | 250/494.1 |
| 2003/0204283 | A1 * | 10/2003 | Picard | B23K 26/032 |
| | | | | 700/166 |
| 2007/0164005 | A1 | 7/2007 | Matsuda | |
| 2009/0032394 | A1 | 2/2009 | Wu | |
| 2010/0195194 | A1 | 8/2010 | Chen et al. | |
| 2013/0146569 | A1 * | 6/2013 | Woods | B23K 26/20 |
| | | | | 219/121.72 |
| 2013/0148925 | A1 * | 6/2013 | Muendel | G02B 6/4216 |
| | | | | 385/27 |
| 2013/0223792 | A1 * | 8/2013 | Huber | G02B 6/262 |
| | | | | 385/127 |
| 2014/0021178 | A1 * | 1/2014 | Brockmann | G02B 6/3528 |
| | | | | 219/121.77 |
| 2016/0016369 | A1 * | 1/2016 | Tarbutton | B29C 64/106 |
| | | | | 264/435 |
| 2016/0184925 | A1 * | 6/2016 | Huang | B23K 26/0626 |
| | | | | 219/76.1 |
| 2019/0084082 | A1 | 3/2019 | Ito | |
| 2019/0262949 | A1 | 8/2019 | Malinowski et al. | |

FOREIGN PATENT DOCUMENTS

| | | | | |
|---|---|---|---|---|
| JP | H07113922 | 12/1995 | | |
| JP | 2001166172 | 6/2001 | | |
| JP | 200455366 | 5/2004 | | |
| JP | 2010115686 | 5/2010 | | |
| JP | 2011134736 | 7/2011 | | |
| JP | 2011221191 A | 11/2011 | | |
| JP | 2014509263 A | 4/2014 | | |
| WO | 2004056524 | 7/2004 | | |
| WO | 2016/031895 A1 | 3/2016 | | |
| WO | WO-2016031895 A1 * | 3/2016 | ............ | A61B 18/20 |
| WO | 2016198724 | 12/2016 | | |

(56) References Cited

FOREIGN PATENT DOCUMENTS

| WO | 2017036695 | 3/2017 |
|---|---|---|
| WO | 2018063452 | 4/2018 |

OTHER PUBLICATIONS

D. Z. Anderson, M. A. Bolshtyansky, and B. Ya. Zel'dovich, "Stabilization of the speckle pattern of a multimode fiber undergoing bending," Opt. Lett. 21, 785-787 (1996) (Year: 1996).*

Xianqing Jin and Frank P. Payne, "Numerical Investigation of Microbending Loss in Optical Fibres," J. Lightwave Technol. 34, 1247-1253 (2016) (Year: 2016).*

Martin Plöschner and TomášČižmár, "Compact multimode fiber beam-shaping system based on GPU accelerated digital holography," Opt. Lett. 40, 197-200 (2015) (Year: 2015).*

Ramachandran, Siddharth and Kristensen, Poul. "Optical vortices in fiber" Nanophotonics, vol. 2, No. 5-6, 2013, pp. 455-474. https://doi.org/10.1515/nanoph-2013-0047 (Year: 2013).*

Uden et al. (Ultra-high-density spatial division multiplexing with a few-mode multicore fibre. Nature Photonics, 8(11), 865-870, 2014; (Year: 2014).*

Rudolf Weber, Andreas Michalowski, Marwan Abdou-Ahmed, Volkher Onuseit, Volker Rominger, Martin Kraus, Thomas Graf, Effects of Radial and Tangential Polarization in Laser Material Processing, Physics Procedia, vol. 12, Part A, 2011, pp. 21-30, ISSN 1875-3892 (Year: 2011).*

Amy Van Newkirk, J. E. Antonio-Lopez, Amado Velazquez-Benitez, Jacques Albert, Rodrigo Amezcua-Correa, and Axel Schülzgen, "Bending sensor combining multicore fiber with a mode-selective photonic lantern," Opt. Lett. 40, 5188-5191 (2015) (Year: 2015).*

Leon-Saval et al.; Photonic Lanterns; nanophotonics 2013; 2(5-6) p. 429-440.

Cindy Fernandes et al.; Curvature and Vibration Sensing Based on Core Diameter Mismatch Structures; IEEE transaction on Instrumentation and Measurement, vol. 65. No. 9; Sep. 2016; pp. 2120-2128.

Victor, Brian M. "Custom beam Shaping for High-Power Fiber Laser Welding" Thesis, the Ohio State University 2009.

Anderson et al. "Stabilization of the Speckle Pattern of a Multimode Fiber Undergoing Bending", Opt Lett. Jun. 1, 1996;21(11): 785-787.

Kuang et al. "Plastic Optical Fiber Displacement Sensor Based on Dual Cycling Bending", Sensors 2010,10, 10198-10210; doi: 10.339/s101110198.

Donlagic et al., "Propagation of the Fundamental mode in Curved Graded Index Multimode Fiber and Its Application in Sensor Systems", Journal of Lightwave Technology, vol. 18, No. 3, Mar. 2000.

* cited by examiner

METHODS OF AND SYSTEMS FOR PROCESSING USING ADJUSTABLE BEAM CHARACTERISTICS

RELATED APPLICATIONS

This application is a continuation of U.S. patent application Ser. No. 17/127,746. filed Dec. 18, 2020, which is a continuation of U.S. patent application Ser. No. 15/883,480, filed Jan. 30, 2018, which is a continuation-in-part of international application PCT/US2017/034848, filed May 26, 2017, which claims the benefit of U.S. Provisional Application No. 62/401,650, filed Sep. 29, 2016. The '480 application is also a continuation-in-part of U.S. patent application Ser. No. 15/607,411, filed May 26, 2017, now U.S. Pat. No. 10,423,015, issued Sep. 24, 2019, which claims the benefit of U.S. Provisional Application No. 62/401,650, filed Sep. 29, 2016. The '480 application is also a continuation-in-part of U.S. patent application No. 15/607,410, filed May 26, 2017, now U.S. Pat. No. 10,663,767, issued May 26, 2020, which claims the benefit of U.S. Provisional Application No. 62/401,650, filed Sep. 29, 2016. The '480 application is also a continuation-in-part of U.S. patent application Ser. No. 15/607,399, filed May 26, 2017, now U.S. Pat. No. 10,295,845, which claims the benefit of U.S. Provisional Application No. 62/401,650, filed Sep. 29, 2016. All of the above applications are herein incorporated by reference in their entireties.

TECHNICAL FIELD

The subject matter disclosed herein generally relates to methods of and systems for processing optical beams, such as laser beams associated with fiber-coupled lasers (e.g., disk lasers, diode lasers, fiber lasers, yttrium aluminum garnet ("YAG") lasers). The subject matter disclosed herein also relates to methods of and systems for processing using adjustable beam characteristics, such as beam diameter, spot size, divergence profile, spatial profile, beam shape, or the like, or any combination thereof, at an output, for example, of fiber-coupled lasers.

BACKGROUND

The use of high-power, fiber-coupled lasers continues to gain popularity for a variety of applications, such as materials processing, cutting, welding, and/or additive manufacturing. These lasers include, for example, fiber lasers, disk lasers, diode lasers, diode-pumped solid state lasers, and lamp-pumped solid state lasers. In these systems, optical power is delivered from the laser to a work piece via an optical fiber.

Various fiber-coupled laser materials processing tasks require different beam characteristics (e.g., spatial profiles and/or divergence profiles). For example, cutting thick metal and welding generally require a larger beam diameter or spot size than cutting thin metal. Ideally, the laser beam properties would be adjustable to enable optimized processing for these different tasks. Conventionally, users have two choices: (1) employ a laser system with fixed beam characteristics that can be used for different tasks but not optimal for most of them (i.e., a compromise between performance and flexibility); or (2) purchase a laser system or accessories that offer variable beam characteristics but that add significant cost, size, weight, complexity, and perhaps performance degradation (e.g., optical loss or reduced speed due to delays involved while varying beam characteristics) or reliability degradation (e.g., reduced robustness or up-time). Currently available laser systems capable of varying beam characteristics typically require the use of free-space optics or other complex and expensive add-on mechanisms (e.g., zoom lenses, mirrors, translatable or motorized lenses, combiners, etc.) in order to vary beam characteristics. No solution appears to exist which provides the desired adjustability in beam characteristics that minimizes or eliminates reliance on the use of free-space optics or other extra components that add significant penalties in terms of cost, complexity, performance, and/or reliability. What is needed is an in-fiber apparatus for providing varying beam characteristics that does not require or minimizes the use of free-space optics and that can avoid significant cost, complexity, performance tradeoffs, and/or reliability degradation.

During additive manufacturing, standard laser beam shapes available on commercial additive manufacturing ("AM") systems typically are not optimized for ail the laser process capabilities that can be used during AM. Nor do commercial AM systems generally provide the ability to rapidly adjust laser beam properties during processing.

One of the factors determining the productivity of an additive system is the build rate. The term "build rate" refers to the time required to fuse a unit volume of, for example, powder or wire. The higher the build rate, the faster the productivity. However, higher build rates can produce (1) coarser resolution of final products, (2) higher heat input requirements, (3) higher residual stresses in final products, (4) undesirable microstructures in final products, and/or (5) reductions in mechanical properties of final products. This trade-off in build rate and part quality he to define the value of an AM tool. Typically, different parameters are used for areas of the build where different build rates are required (for example contouring versus bulk filling, or dissimilar cladding versus similar deposition). The parameters that are adjusted are usually locus position, laser power, and/or speed. These limited variables produce limited process benefits.

There is an issue with doing these adjustments depending on what the X-Y position is in the plane being created. For example, with powder bed fusion, a layer of powder may overlay what could be an existing fused structure or unfused powder, and control over the laser parameters as the laser beam moves across these structures would provide a better final part (less distortion, less porosity, better dimensional accuracy). This control also pertains to the finished part roughness, as that is tied to the resolution used to create the edge of each layer.

Typically, standard commercial AM systems do not have the capability to pre-heat a powder bed or a substrate above 400° C. This pre-heating is generally accomplished from the exterior of the build envelops (e.g., using a heated platform or chamber). Thermal energy typically is generated electrically (resistive or inductive). The unfused powder is very insulative. The shape and density of the structure being built can vary from build-to-build. The complications associated with these factors make it difficult to provide a uniform and repeatable temperature in the build volume with such traditional heating methods.

At the same time, a laser source and associated beam delivery system usually are developed for a single process; welding, cutting, cladding, drilling, marking, etc. As a result, an expensive laser AM tool may be capable of being used in only one process. The versatility and value of such an AM tool may be severely limited by this single-process capability.

SUMMARY

At least, disclosed herein are methods of and systems for processing using adjustable beam characteristics.

In some examples, a method of processing by controlling one or more beam characteristics of an optical beam can comprise: launching the optical beam into a first length of fiber having a first refractive-index profile ("RIP"), coupling the optical beam from the first length of fiber into a second length of fiber having a second RIP and one or more confinement regions; modifying the one or more beam characteristics of the optical beam in the first length of fiber, in the second length of fiber, or in the first and second lengths of fiber; confining the modified one or more beam characteristics of the optical beam within the one or more confinement regions of the second length of fiber; and/or generating an output beam, having the modified one or more beam characteristics of the optical beam, from the second length of fiber. The first RIP can differ from the second RIP.

In some examples, the method can further comprise: adjusting a BPP of the output beam for ablating, cladding, cutting, drilling, engraving, glazing, heat-treating, marking, patterning, roughening, smoothing, surface texturing, trepanning, and or welding one or more parts of a product.

In some examples, the method can further comprise: adjusting a beam quality factor ($M^2$ factor) of the output beam for ablating, cladding, cutting, drilling, engraving, glazing, heat-treating, marking, patterning, roughening, smoothing, surface texturing, trepanning, and/or welding one or more parts of a product.

In some examples, the method can further comprise: modulating the output beam while ablating, cladding, cutting, drilling, engraving, glazing, heat-treating, marking, patterning, roughening, smoothing, surface texturing, trepanning, and/or welding one or more parts of a product. The modulating of the output beam can occur, for example, during and/or after manufacture of the product.

In some examples, the output beam can be generated as a series of pulses, one or or more characteristics of the output beam can be modified in a series of pulses, or the output beam can be generated as a series of poises and one or more characteristics of the output beam can be modified in a series of pulses.

In some examples, the output beam can be modulated at a selected frequency, one or more characteristics of the output beam can be modulated at a selected frequency, or the output beam and one or more characteristics of the output beam can be modulated at a selected frequency.

In some examples, the output beam can be modulated at a selected duty cycle, one or more characteristics of the output beam can be modulated at a selected duty cycle, or the output beam end one or more characteristics of the output beam can be modulated at a selected duty cycle.

In some examples, the method can further comprise: using the output beam for ablating, cladding, cutting, drilling, engraving, glazing, heat-treating, marking, patterning, roughening, smoothing, surface texturing, trepanning, and/or welding one or more parts of a product. The using of the output beam can occur, for example, during and/or after manufacture of the product.

In some examples, the method can further comprise: increasing power density of the output beam for ablating, cladding, cutting, drilling, engraving, glazing, marking, patterning, roughening, surface texturing, trepanning, and/or welding one or more parts of a product. The increasing of the power density can occur, for example, during and/or after manufacture of the product.

In some examples, the method can further comprise: decreasing power density of the output beam for cladding, cutting, engraving, glazing, heat-treating, marking, patterning, smoothing, surface texturing, and/or trepanning one or more parts of a product. The decreasing of the power density can occur, for example, during and/or after manufacture of the product.

In some examples, the method can further comprise: increasing beam diameter of the output beam for heat-treating and/or smoothing one or more parts of a product. The increasing of the beam diameter can occur, for example, during acid or after manufacture of the product.

In some examples, the method can further comprise: in additive processing, alternately using the output beam to pre-heat powder prior to fusing the powder and using the output beam to fuse the powder.

In some examples, the method can further comprise: in additive processing, alternately using the output beam to pre-heat powder prior to fusing the powder and using the output beam to post-heat the fused powder.

In some examples, the method can further comprise: in additive processing, alternately using the output beam to fuse powder and using the output beam to post-heat the fused powder.

In some examples, the method can further comprise: in additive processing, alternately using the output beam to pre-heat powder prior to fusing the powder, using the output beam to fuse the powder, and using the output beam to post-heat the fused powder.

In some examples, the method can further comprise: in additive processing, using a first portion of the output beam to pre-heat powder prior to fusing the powder, and simultaneously using a second portion of the output beam to fuse the powder.

In some examples, the method can further comprise: in additive processing, using a first portion of the output beam to fuse powder, and simultaneously using a second portion of the output beam to post-heat the fused powder.

In some examples, the method can further comprise: in additive processing, using a first portion of the output beam to pre-heat powder prior to fusing the powder, and simultaneously using the first portion of the output beam to post-heat the fused powder.

In some examples, the method can further comprise: in additive processing, using a first portion of the output beam to pre-heat powder prior to fusing the powder, simultaneously using a second portion of the output beam to fuse the powder, and simultaneously using the first portion of the output beam to post-heat the fused powder.

In some examples, a method of processing by controlling one or more beam characteristics of an optical beam can comprise; launching the optical beam into a first length of fiber having a first RIP: coupling the optical beam from the first length of fiber into a second length of fiber having a second RIP and two or more confinement regions; modifying the one or more beam characteristics of the optical beam in the first length of fiber, in the second length of fiber, or in the first and second lengths of fiber; confining the modified one or more beam characteristics of the optical beam within the two or more confinement regions of the second length of fiber; and/or generating an output beam, having the modified one or more beam characteristics of the optical beam, from the second length of fiber. The that RIP can be the same as the second RIP.

It is to be understood that both the foregoing general description and the following detailed description are exemplary and explanatory only, and are not restrictive of the present teachings, as claimed.

BRIEF DESCRIPTION OF THE DRAWINGS

The above and/or other aspects and advantages will become more apparent and more readily appreciated from the following detailed description of examples, taken in conjunction with the accompanying drawings, in which.

DETAILED DESCRIPTION

Figure 1:
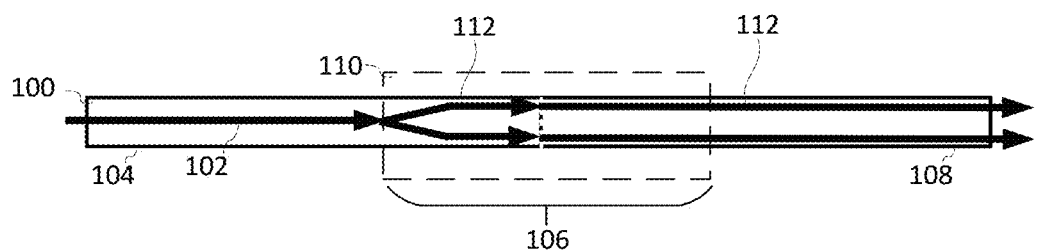
FIG. 1 illustrates an example fiber structure for providing a laser beam having variable beam characteristics.

Exemplary aspects will now be described more fully with reference to the accompanying drawings. Examples of the disclosure, however, can be embodied in many different forms and should not be construed as being limited to the examples set forth herein. Rather, these examples are provided so that this disclosure will be thorough and complete, and will fully convey the scope to one of ordinary skill in the art. In the drawings, some details may be simplified and/or may be drawn to facilitate understanding rather than to maintain strict structural accuracy, detail, and/or scale. For example, the thicknesses of layers and regions may be exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, or section could be termed a second element, component, region, layer, or section without departing from the teachings of examples.

Spatially relative terms, such as "beneath," "below" "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation(s) depicted in the figures.

The terminology used herein is for the purpose of describing particular examples only and is not intended to be limiting of examples. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases he rearranged or performed concurrently. Moreover, for the sake of simplicity, the attached figures may not show the various ways in which the disclosed systems, methods, and apparatuses can be used in conjunction with ether systems, methods, and apparatuses. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by a person of ordinary skill in the art.

Unless otherwise defined, all terms (including technical and scientific terms) used herein have the same meaning as understood by one of ordinary skill in the art. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

The present disclosure is directed to methods of and systems for processing using adjustable beam characteristics.

Definitions

Definitions of words and terms as used herein:
1. The term "beam characteristics" refers to one or more of the following terms used to describe an optical beam. In general, the beam characteristics o f most interest depend on the specifics of the application or optical system.
2. The term "beam diameter" is defined as the distance across the center of the beam along an axis for which the irradiance (intensity) equals $1/e^2$ of the maximum irradiance (as understood by a person haying ordinary skill in the art ("PHOSITA")), other measures of beam diameter include, for example, full width at half maximum ("FWHM") and second moment width/distance between $4\sigma$ values ("D4$\sigma$")). While examples disclosed herein generally use beams that propagate in azimuthally symmetric modes, elliptical or other beam shapes can be used, and beam diameter can be different along different axes. Circular beams are characterized by a single beam diameter. Other beam shapes can have different beam diameters along different axes.
3. The term "spot size" is the radial distance (radius) from the center point of maximum irradiance to the $1/e^2$ point (or equivalent for other measures of beam diameter—see definition of "beam diameter" above).
4. The term "beam divergence distribution" is the distribution of enclosed power within a given propagation angle (e.g., full power vs. full cone angle). This quantity is sometimes called the "angular distribution"or "NA distribution."
5. The term "beam parameter product" ("BPP") of a laser beam is defined as the product of the beam radius (measured at the beam waist) and the beam divergence half-angle (measured in the far field). The units of BPP are typically millimeters-milliradians ("mm-mrad").
6. A "confinement fiber" is defined to be a fiber that possesses one or more confinement regions, wherein a confinement region comprises a higher-index region (core region) surrounded by a lower-index region (cladding region). The RIP of a confinement fiber may include one of more higher-index regions (core regions) surrounded by lower-index regions (cladding regions), wherein light is guided in the higher-index regions. Each confinement region and each cladding region can have any RIP, including but not limited to step index and graded-index. The confinement regions may or may not be concentric and may be a variety of shapes such as circular, annular, polygonal, arcuate, elliptical, irregular, or the like, or any combination thereof. The confinement regions in a particular confinement fiber may all have the same shape or may be different shapes. Moreover, confinement regions may be co -axial or may have offset axes with respect to one another. Confinement regions may be of uniform thickness about a central axis in the longitudinal direction, or the thicknesses may vary about the central axis in the longitudinal direction.
7. The term "intensity distribution" refers to optical intensity as a function of position along a line (one-dimensional ("1D") profile) or on a plane (two-dimensional ("2D") profits). The line or plane is usually taken perpendicular to the propagation direction of the light. It is a quantitative property.
8. "Luminance" is a photometric measure of the luminous intensity per unit area of light travelling in a given direction.
9. "$M^2$ factor" (also called "beam quality factor" or "beam propagation factor") is a dimensionless parameter for quantifying the beam quality of laser beams, with $M^2=1$ being a diffraction-limited beam, and larger values of the $M^2$ factor corresponding to lower beam quality. $M^2$ is equal to the BPP divided by $\lambda/\pi$, where $\lambda$ is the wavelength of the beam in microns (if BPP is expressed in units of mm-mrad).
10. The term "numerical aperture" or "NA" of an optical system is a dimensionless number that characterizes the range of angles over which the system can accept or emit light.
11. The term "optical intensity" is not an official (SI) unit, but is used to denote incident power per unit area on a surface or passing through a plane.
12. The term "power density" refers to optical power per unit area, although this is also referred to as "optical intensity."
13. The term "radial beam position" refers to the position of a beam in a fiber measured with respect to the center of the fiber core in a direction perpendicular to the fiber axis.
14. "Radiance" is the radiation emitted per unit solid angle in a given direction by a unit area of an optical source (e.g., a laser), Radiance may be altered by changing the beam intensity distribution and/or beam divergence profile or distribution. The ability to vary the radiance profile of a laser beam implies the ability to vary the BPP.
15. The term "refractive-index profile" or "RIP" refers to the refractive index as a function of position along a line (1D) or in a plane (2D) perpendicular to the fiber axis. Many fibers are azimuthally symmetric, in which case the 1D RIP is identical for any azimuthal angle.

16. A "step-index fiber" has a RIP that is flat (refractive index independent of position) within the fiber core.
17. A "graded-index fiber" has a RIP in which the refractive index decreases with increasing radial position (i.e., with increasing distance from the center of the fiber core).
18. A "parabolic-index fiber" is a specific case of a graded-index fiber in which the refractive index decreases quadratically with increasing distance from the center of the fiber core.
19. The term "additive manufacturing" refers to processes of joining materials to make parts from three-dimensional ("3D") model data, usually layer upon layer, as opposed to subtractive manufacturing and formative manufacturing methodologies. Powder bed fusion, for example, is one common additive material process.
20. The term "kerf width" refers to the width of material that is removed during operations that remove material (e.g., cutting).
21. The term "build rate" refers to the time required to fuse a unit volume of, for example, powder or wire.
22. The terms "fuse" and "fusing" refer to sintering, melting (e.g., partially or fully melting), chemical bonding, or any other phenomena in which particles are joined together using heat (e.g., coalescing of two or more materials due to application of heat).

Fiber for Varying Beam Characteristics

Disclosed herein are methods, systems, and apparatus configured to provide a fiber operable to provide a laser beam having variable beam characteristics ("VBC") that may reduce cost, complexity, optical loss, or other drawbacks of the conventional methods described above. This VBC fiber is configured to vary a wide variety of optical beam characteristics. Such beam characteristics can be controlled using the VBC fiber thus allowing users to tune various beam characteristics to suit the particular requirements of an extensive variety of laser processing applications. For example, VBC fiber may be used to tune: beam diameter, beam divergence distribution, BPP, intensity distribution:, $M^2$ factor, NA, optical intensity, power density, radial beam position, radiance, spot size, or the like, or any combination thereof.

In general, the disclosed technology entails coupling a laser beam into a fiber in which the characteristics of the laser beam in the fiber can be adjusted by perturbing the laser beam and/or perturbing a first length of fiber by any of a variety of methods (e.g., bending the fiber or introducing one or more other per and fully or partially maintaining adjusted beam characteristics in a second length of fiber. The second length of fiber is specially configured to maintain and/or further modify the adjusted beam characteristics. In some cases, the second length of fiber preserves the adjusted beam characteristics through delivery of the laser beam to its ultimate use (e.g., materials processing). The first and second lengths of fiber may comprise the same or different fibers.

The disclosed technology is compatible with fiber-coupled lasers (e.g., disk lasers, diode lasers, fiber lasers, YAG lasers). Fiber-coupled lasers typically deliver an output via a delivery fiber having a step-index refractive index profile ("RIP"), i.e., a flat or constant refractive index within the fiber core. In reality, the RIP of the delivery fiber may not be perfectly flat, depending on the design of the fiber, important parameters are the fiber core diameter ("$d_{core}$") and NA. The core diameter is typically in the range of 10-1000 microns (although other values are possible), and the NA is typically in the range of 0.06-0.22 (although other values are possible). A delivery fiber from the laser may be routed directly to the process head or work piece, or it may be routed to a fiber-to-fiber coupler ("FFC") or fiber-to-fiber switch ("FFS"), which couples the light from the delivery fiber into a process fiber that transmits the beam to the process head or the work piece.

Most materials processing tools, especially those at high power (>1 kilowatt ("kW")), employ multimode ("MM") fiber, but some employ single-mode ("SM") fiber, which is at the lower end of the $d_{core}$ and NA ranges. The beam characteristics from a SM fiber are uniquely determined by the fiber parameters. The beam characteristics from a MM fiber, however, can vary (unit-to-unit and/or as a function of laser power and time), depending on the beam characteristics from the laser source(s) coupled into the fiber, the launching or splicing conditions into the fiber, the fiber RIP, and the static and dynamic geometry of the fiber (bending, coiling, motion, micro-bending, etc.). For both SM and KW delivery fibers, the beam characteristics may rot be optimum for a given materials processing task, and it is unlikely to be optimum for a range of tasks, motivating the desire to be able to systematically vary the beam characteristics in order to customize or optimize them for a particular processing task.

In one example, the VBC fiber may have a first length and a second length and may be configured to be interposed as an in-fiber device between the delivery fiber and the process head to provide the desired adjustability of the beam characteristics. To enable adjustment of the beam, a perturbation device and/or assembly is disposed in close proximity to and/or coupled with the VBC fiber and is responsible for perturbing the beam in a first length such that the beam's characteristics are altered in the first length of fiber, and the altered characteristics are preserved or further altered as the beam propagates in the second length of fiber. The perturbed beam is launched into a second length of the VBC fiber configured to conserve adjusted beam characteristics. The first and second lengths of fiber may be the same or different fibers and/or the second length of fiber may comprise a confinement fiber. The beam characteristics that are conserved by the second length of VBC fiber may include any of: angular distribution, azimuthal intensity distribution, beam diameter, beam divergence distribution, BPP, beam profile (e.g., Gaussian, flat-top), beam shape, divergence, divergence profile, intensity distribution, luminance, $M^2$ factor, NA, optical intensity profile, optical mode (e ,g., filtering), power density profile, radial beam position, radiance, spatial profile distribution, spot shape, spot size, or the like, or any combination thereof.

FIG. 1 illustrates an example VBC fiber 100 for providing a laser beam having variable beam characteristics without requiring the use of free-space optics to change the beam characteristics. VBC fiber 100 comprises a first length of fiber 104 and a second length of fiber 108. First length of fiber 104 and second length of fiber 108 may be the same or different fibers and may nave the same or different RIPs. The first length of fiber 104 and the second length of fiber 108 may be joined together by a splice. First length of fiber 104 and second length of fiber 108 may be coupled in other ways, may be spaced apart, or may be connected via an interposing component such as another length of fiber, free-space optics, glue, index-matching material, or the like, or any combination thereof.

A perturbation device 110 is disposed proximal to and/or envelops perturbation region 106. Perturbation device 110 may be a device, assembly, in-fiber structure, and/or other feature. Perturbation device 110 at least perturbs optical beam 102 in first length of fiber 104 or second length of fiber 108 or a combination thereof in order to adjust one or more beam characteristics of optical beam 102. Adjustment of optical beam 102 responsive to perturbation by perturbation device 110 may occur in first length of fiber 104 or second length of fiber 108 or a combination thereof. Perturbation region 106 may extend over various widths and may or may not extend into a portion of second length of fiber 108. As optical beam 102 propagates in VBC fiber 100, perturbation device 110 may physically act VBC fiber 100 to perturb the fiber and adjust the characteristics of optical beam 102. Alternatively, perturbation device 110 may act directly on optical beam 102 to alter its beam characteristics. Subsequent to being adjusted, perturbed beam 112 has different beam characteristics than optical beam 102, which will be fully or partially conserved in second length of fiber 108. In another example, perturbation device 110 need not be disposed near a splice. Moreover, a splice may not be needed at all, for example VBC fiber 100 may be a single fiber, first length of fiber and second length of fiber could be spaced apart, or secured with a small gap (air-spaced or filled with an optical material, such as optical cement or an index-matching material).

Perturbed beam 112 is launched into second length of fiber 108, where perturbed beam 112 characteristics are largely maintained or continue to evolve as perturbed beam 112 propagates yielding the adjusted beam characteristics at the output of second length of fiber 108. In one example, the new beam characteristics may include an adjusted intensity distribution. In an example, an altered beam intensity distribution will be conserved in various structurally bounded confinement regions of second length of fiber 108. Thus, the beam intensity distribution may be tuned to a desired beam intensity distribution optimized for a particular laser processing task. In general, the intensity distribution of perturbed beam 112 will evolve as it propagates in the second length of fiber 108 to fill the confinement region(s) into which perturbed beam 112 is launched responsive to conditions in first length of fiber 104 and perturbation caused by perturbation device 110. In addition, the angular distribution may evolve as the beam propagates in the second fiber, depending on launch conditions and fiber characteristics. In general, fibers largely preserve the input divergence distribution, but the distribution can be broadened if the input divergence distribution is narrow and/or if the fiber has irregularities or deliberate features that perturb the divergence distribution. The various confinement regions, perturbations, and fiber features of second length of fiber 108 are described in greater detail below. Optical beam 102 and perturbed beam 112 are conceptual abstractions intended to illustrate how a beam may propagate through a VBC fiber 100 for providing variable beam characteristics and are not intended to closely model the behavior of a particular optical beam.

VBC fiber 100 may be manufactured by a variety of methods including Plasma Chemical Vapor Deposition ("PCVD"), Outside Vapor Deposition ("OVD"), Vapor Axial Deposition ("VAD"), Metal-Organic Chemical Vapor Deposition ("MOCVD"), and/or Direct Nanoparticle Deposition ("DND"). VBC fiber 100 may comprise a variety of materials. For example, VBC fiber 100 may comprise $SiO_2$, $SiO_2$ doped with $GeO_2$, germanosilicate, phosphorus pentoxide, phosphosilicate, $Al_2O_3$, aluminosilicate, or the like, or any combination thereof. Confinement regions may be bounded by deciding doped with fluorine, boron, or the like, or any combination thereof. Other dopants may be added to active fibers, including rare-earth ions such as $Er^{3+}$ (erbium), $Yb^{3+}$ (ytterbium), $Nd^{3+}$ (neodymium), $Tm^{3+}$ (thulium), $Ho^{3+}$ (holmium), or the like, or any combination thereof. Confinement regions may be bounded by cladding having a lower index than the confinement region with fluorine or boron doping. Alternatively, VBC fiber 100 may comprise photonic crystal fibers or micro-structured fibers.

VBC fiber 100 is suitable for use in any of a variety of fiber, fiber optic, or fiber laser devices, including continuous wave and pulsed fiber lasers, disk lasers, solid state lasers, or diode lasers (pulse rate unlimited except by physical constraints). Furthermore, implementations in a planar waveguide or other types of waveguides and not just fibers are within the scope of the claimed technology.

Figure 2:
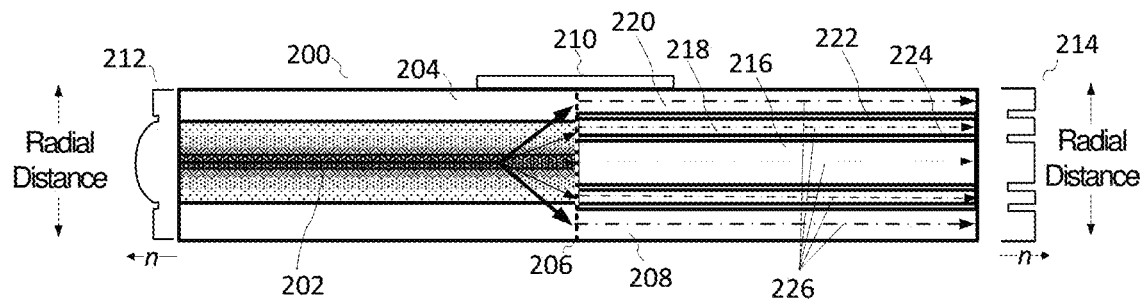
FIG. 2 depicts a cross-sectional view of an example fiber structure for delivering a beam with variable beam characteristics.

FIG. 2 depicts a cross-sectional view of an example VBC fiber 200 for adjusting beam characteristics of an optical beam. In an example, VBC fiber 200 may be a process fiber because it may deliver the beam to a process head for material processing. VBC fiber 200 comprises a first length of fiber 204 spliced at splice junction 206 to a second length of fiber 208. A perturbation assembly 210 is disposed proximal to splice junction 206. Perturbation assembly 210 may be any of a variety of devices configured to enable adjustment of the beam characteristics of an optical beam 202 propagating in VBC fiber 200. In an example, perturbation assembly 210 may be a mandrel and/or another device that may provide means of varying the bend radius and/or bend length of VBC fiber 200 near the splice. Other examples of perturbation devices are discussed below with respect to FIG. 24.

In an example, first length of fiber 204 has a parabolic-index first RIP 212 as indicated by the left RIP graph. Most of the intensity distribution of optical beam 202 is concentrated in the center of first length of fiber 204 when first length of fiber 204 is straight or nearly straight. Second length of fiber 208 is a confinement fiber having a second RIP 214 as shown in the right RIP graph. Second length of fiber 208 includes confinement regions 216, 218, and 220. Confinement region 216 is a central core surrounded by two annular (or ring-shaped) confinement regions 218 and 220. Layers 222 and 224 are structural barriers of lower index material between confinement regions 216, 216 and/or 220, commonly referred to as "cladding" regions. In one example, layers 222 and 224 may comprise rings of fluorosilicate; In some embodiments, the fluorosilicate cladding layers are relatively thin. Other materials may be used as well and claimed subject matter is not limited in this regard.

In an example, as optical beam 202 propagates along VBC fiber 200, perturbation assembly 210 may physically act on second length of fiber 208 and/or optical beam 202 to adjust its beam characteristics and generate adjusted beam 226. In the current example, the intensity distribution of optical beam 202 is modified by perturbation assembly 210. Subsequent to adjustment of optical beam 202, the intensity distribution of adjusted beam 226 may be concentrated in outer confinement regions 218 and 220 with relatively little intensity in the central core confinement region 216. Because each of confinement regions 216, 218, and/or 220 is isolated by the thin layers of lower index material in barrier layers 222 and 224, second length o fiber 208 can substantially maintain the adjusted intensity distribution of adjusted beam 226. The beam will typically become distributed azimuthally within a given confinement region but will not transition (significantly) between the confinement regions as it propagates along the second length of fiber 208. Thus, the adjusted beam characteristics of adjusted beam 226 are largely conserved within the isolated confinement regions 216, 218, and/or 220. In some cases, it be may desirable to have the adjusted beam 226 power divided among the confinement regions 216, 218, and/or 220 rather than concentrated in a single region, and this condition may be achieved by generating an appropriately adjusted beam 226.

In one example, central core confinement region 216 and annular confinement regions 218 and 220 may be composed of fused silica glass, and cladding 222 and 224 defining the confinement regions may be composed of fluorosilicate glass. Other materials may be used to form the various confinement regions 216, 218, and/or 220, including germanosilicate, phosphosilicate, aluminosilicate, or the like, or a combination thereof, and claimed subject matter is not so limited. Other materials may be used to form the barrier rings 222 and/or 224, including fused silica, borosilicate, or the like, or a combination thereof, and claimed subject matter is not so limited. In other embodiments, the optical fibers or waveguides include or are composed of various polymers, plastics, or crystalline materials. Generally, the core confinement regions have refractive indices that are greater than the refractive indices of adjacent barrier/cladding regions.

In some examples, it may be desirable to increase a number of confinement regions in a second length of fiber to increase granularity of beam control over beam displacements for fine-tuning a beam profile. For example, confinement regions may be configured to provide stepwise beam displacement.

Figure 3:
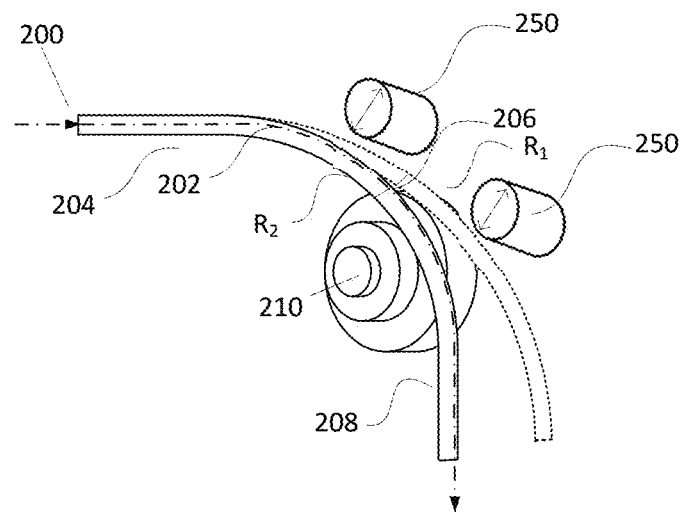
FIG. 3 illustrates an example method of perturbing a fiber structure for providing a beam having variable beam characteristics.

FIG. 3 illustrates an example method of perturbing VBC fiber 200 for providing variable beam characteristics of an optical beam. Changing the bend radius of a fiber may change the radial beam position, divergence angle, and/or radiance profile of a beam within the fiber. The bend radius of VBC fiber 200 can be decreased from a first bend radius $R_1$ to a second bend radius $R_2$ about splice junction 206 by using a stepped mandrel or cone as the perturbation assembly 210. Additionally or alternatively, the engagement length on the mandrel(s) or cone can be varied. Rollers 250 may be employed to engage VBC fiber 200 across perturbation assembly 210. In an example, an amount of engagement of rollers 250 with VBC fiber 200 has been shown to shift the distribution of the intensity profile to the outer confinement regions 218 and 220 of VBC fiber 200 with a fixed mandrel radius. There are a variety of other methods for varying the bend radius of VBC fiber 200, such as using a clamping assembly, flexible tubing, or the like, or a combination thereof, and claimed subject matter is not limited in this regard. In another example, for a particular bend radius the length over which VBC fiber 200 is bent can also vary beam characteristics in a controlled and reproducible way. In examples, changing the bend radius and for length over which the fiber is bent at a particular bend radius also modifies the intensity distribution of the beam such that one or more modes may be shifted radially away from the center of a fiber core.

Maintaining the bend radius of the fibers across splice junction 206 ensures that the adjusted beam characteristics such as radial beam position and radiance profile of optical beam 202 will not return to optical beam 202's unperturbed state before being launched into second length of fiber 208. Moreover, the adjusted radial beam characteristics, including position, divergence angle, and/or intensity distribution, of adjusted beam 226 can be varied based on an extent of decrease in the bend radius and/or the extent of the bend length of VBC fiber 200. Thus, specific beam characteristics may be obtained using this method.

In the current example, first length of fiber 204 having first RIP 212 is spliced at splice junction 206 to a second length of fiber 208 having the second RIP 214. However it is possible to use a single fiber having a single RIP formed to enable perturbation (e.g., by micro-bending) of the beam characteristics of optical beam 202 and also to enable conservation of the adjusted beam. Such a RIP may be similar to the RIPS shown in fibers illustrated in FIGS. 17, 18, and/or 19.

Figure 4:
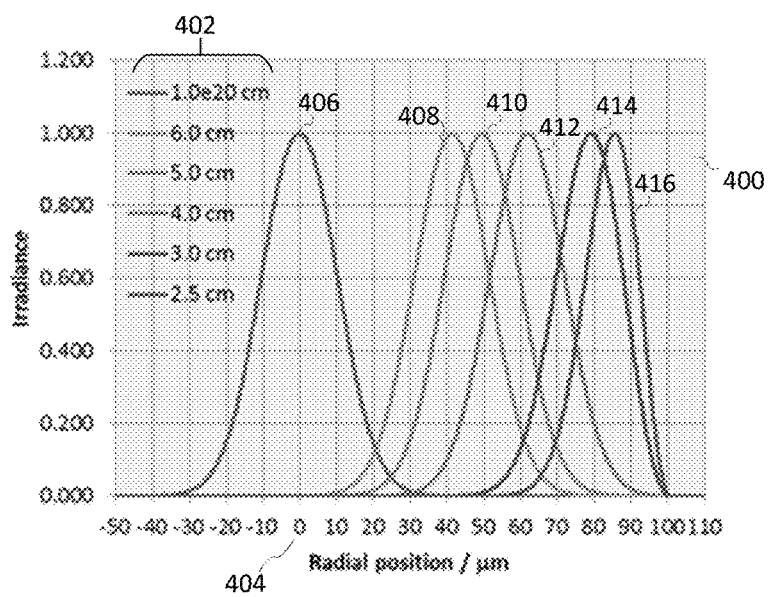
FIG. 4 is a graph illustrating the calculated spatial profile of the lowest-order mode ($LP_{01}$) for a first length of a fiber for different fiber bend radii.
Figure 5:
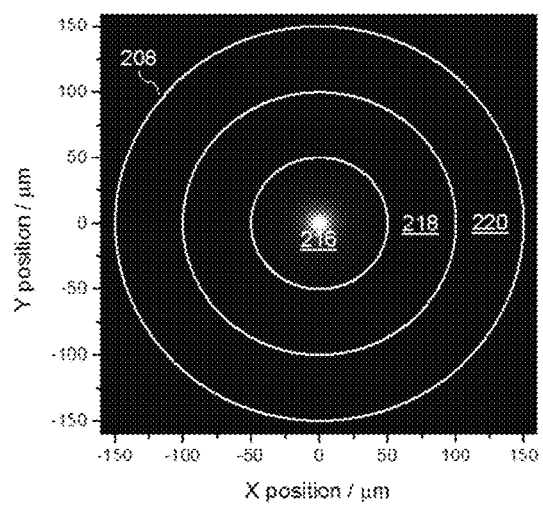
FIG. 5 illustrates an example of a two-dimensional intensity distribution at a junction when a fiber for varying beam characteristics is nearly straight.
Figure 6:
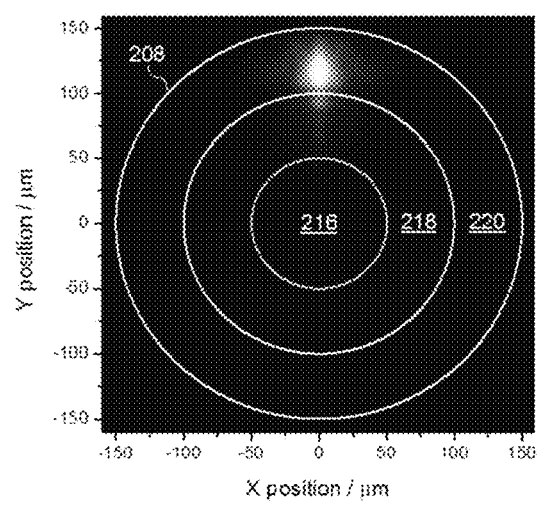
FIG. 6 illustrates an example of a two-dimensional intensity distribution at a junction when a fiber for varying beam characteristics is bent with a radius chosen to preferentially excite a particular confinement region of a second length of fiber.

FIGS. 7-10 provide experimental results for VBC fiber 200 (shown in FIGS. 2 and 3) and illustrate further a beam response to perturbation of VBC fiber 200 when a perturbation assembly 210 acts on VBC fiber 200 to bend the fiber. FIGS. 4-6 are simulations and FIGS. 7-10 are experimental results wherein a beam from a SM 1050 nanometer ("nm") source was launched into an input fiber (not shown) with a 40 micron ("µm") core diameter. The input fiber was spliced to first length of fiber 204.

FIG. 4 is an example graph 400 illustrating the calculated profile of the lowest-order mode ($LP_{01}$) for a first length of fiber 204 for different fiber bend radii 402, wherein a perturbation assembly 210 involves bending VBC fiber 200. As the fiber bend radius is decreased, an optical beam propagating in VBC fiber 200 is adjusted such that the mode shifts radially away from the center 404 of a VBC fiber 200 core (r=0 micron or µm) toward the core/cladding interface (located at r=100 microns in this example). Higher-order modes ($LP_{in}$) also shift with bending. Thus, a straight or nearly straight fiber (very large bend radius), curve 406 for $LP_{01}$ is centered at or near the center of VBC fiber 200. At a bend radius of about 6 centimeters ("cm"), curve 408 for $LP_{01}$ is shifted to a radial position of about 40 µm from the center 404 of VBC fiber 200. At a bend radius of about 5 cm, curve 410 for $LP_{01}$ is shifted to a radial position about 50 µm from the center 404 of VBC fiber 200. At a bend radius of about 4 cm, curve 412 for $LP_{01}$ is shifted to a radial position about 60 µm from the center 404 of VBC fiber 200. At a bend radius of about 3 cm, curve 414 for $LP_{01}$ is shifted to a radial position about 80 µm from the center 404 of VBC fiber 200. At a bend radius of about 2.5 cm, a curve 416 for $LP_{01}$ to shifted to a radial position about 85 µm from the center 404 of VBC fiber 200. Note that the shape of the mode remains relatively constant (until it approaches the edge the core), which is a specific property of a parabolic RIP. Although, this property may be desirable in some situations, it is not required for the VBC functionality, and other RIPs may be employed.

In an example, if VBC fiber 200 is straightened, $LP_{01}$ mode will shift back toward the center of the fiber. Thus, the purpose of second length of fiber 208 is to "trap" or confine the adjusted intensity distribution of the beam in a confinement region that is displaced from the center of the VBC fiber 200. The splice between first length of fiber 204 and second length of fiber 208 is included in the bent region, thus the shifted mode profile will be preferentially launched into one of the ring-shaped confinement regions 218 and 220 or be distributed among the confinement regions. FIGS. 5 and 6 illustrate this effect.

FIG. 5 illustrates an example two-dimensional intensity distribution at splice junction 206 within second length of fiber 208 when VBC fiber 200 is nearly straight. A significant portion of $LP_{01}$ and $LP_{in}$ are within confinement region 216 of second length of fiber 208. FIG. 6 illustrates the two-dimensional intensity distribution at splice junction 206 within second length of fiber 208 when VBC fiber 200 is bent with a radius chosen to preferentially excite confinement region 220 (the outermost confinement region) of second length of fiber 208. A significant portion of $LP_{01}$ and $LP_{in}$ are within confinement region 220 of second length of fiber 208.

In an example, second length of fiber 208 confinement region 216 has a 100 micron diameter, confinement region 218 is between 120 micron and 200 micron in diameter, and confinement region 220 is between 220 micron and 300 micron diameter. Confinement regions 216, 218, and 220 are separated by 10 um thick rings of fluorosilicate, providing an NA of 0.22 for the confinement regions. Other inner and outer diameters for the confinement regions, thicknesses of the rings separating the confinement regions, NA values for the confinement regions, and numbers of confinement regions may be employed.

Referring again to FIG. 5, with the noted parameters, when VBC fiber 200 is straight about 90% of the power is contained within the central confinement region 216, and about 100% of the power is contained within confinement regions 216 and 218. Referring now to FIG. 6, when VBC fiber 200 is bent to preferentially excite second ring confinement region 220, nearly 75% of the power is contained within confinement region 220, and more than 95% of the power is contained within confinement regions 218 and 220. These calculations include $LP_{01}$ and two higher-order modes, which is typical in some 2-4 kW fiber lasers.

It is clear from FIGS. 5 and 6 that in the case where a perturbation assembly 210 acts on VBC fiber 200 to bend the fiber, the bend radius determines the spatial overlap of the modal intensity distribution of the first length of fiber 204 with the different guiding confinement regions 216, 218, and/or 220 of the second length of fiber 208. Changing the bend radius can thus change the intensity distribution at the output of the second length of fiber 208, thereby changing the beam diameter or spot size of the beam, and thus also changing its radiance and BPP value. This adjustment of the beam diameter or spot size may be accomplished in art all-fiber structure, involving no free-space optics and consequently may reduce or eliminate the disadvantages of free-space optics discussed above. Such adjustments can also be made with other perturbation assemblies that alter bend radius, bend length, fiber tension, temperature, or other perturbations discussed below.

In a typical materials processing system (e.g., a cutting or welding tool), the output the process fiber is imaged at or near the work piece by the process head. Varying the intensity distribution as shown in FIGS. 5 and 6 thus enables variation of the beam profile at the work piece in order to tune and/or optimize the process, as desired. Specific RIPS for the two fibers were assumed for the purpose of the above calculations, but other RIPs are possible, and claimed subject matter is not limited in this regard.

FIGS. 7-10 depict experimental results (measured intensity distributions) to illustrate further output beams for various bend radii of VBC fiber 200 shown in FIG. 2.

Figure 7:
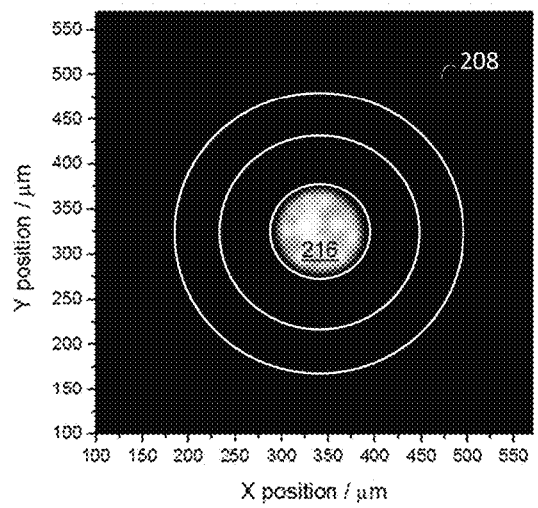
FIGS. 7-10 depict experimental results to illustrate further output beams for various bend radii of a fiber for varying beam characteristics shown in FIG. 2.
Figure 8:
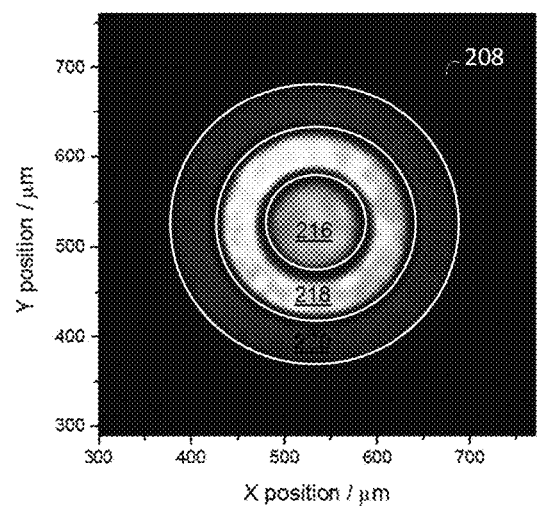
Figure 9:
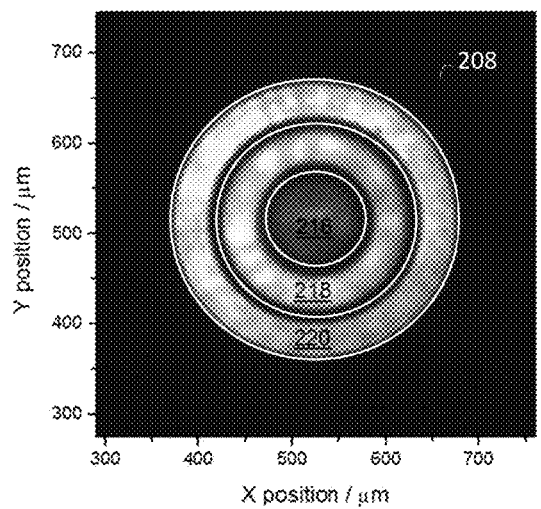
Figure 10:
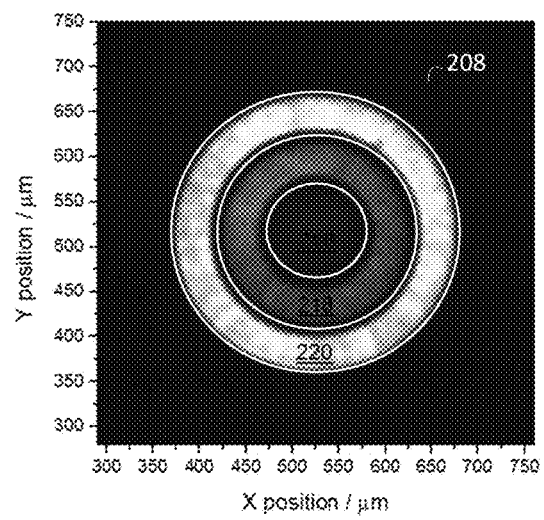

In FIG. 7 when VBC fiber 200 is straight, the beam is nearly completely confined to confinement region 216. A the bend radius is decreased, the intensity distribution shifts to higher diameters (FIGS. 8-10). FIG. 8 depicts the intensity distribution when the bend radius of VBC fiber 200 is chosen to shift the intensity distribution preferentially to confinement region 218. FIG. 9 depicts the experimental results when the bend radius is further reduced and chosen to shift the intensity distribution outward to confinement region 220 and confinement region 218. In FIG. 10, at the smallest bend radius, the beam is needy a "donut mode," with most of the intensity in the outermost confinement region 220.

Despite excitation of the confinement regions from one side at the splice junction 206, the intensity distributions are nearly symmetric azimuthally because of scrambling within confinement regions as the beam propagates within the VBC fiber 200. Although the beam will typically scramble azimuthally as it propagates, various structures or perturbations (e.g., coils) could be included to facilitate this process.

For the fiber parameters used in the experiment shown in FIGS. 7-10, particular confinement regions were not exclusively excited because some intensity was present in multiple confinement regions. This feature may enable advantageous materials processing applications that are optimized by having a flatter or distributed beam into distribution. In applications requiring cleaner excitation of a given confinement region, different fiber RIPs could be employed to enable this feature.

The results shown in FIGS. 7-10 pertain to the particular fibers used in this experiment, and the details will vary depending on the specifics of the implementation. In particular, the spatial profile and divergence distribution of the output beam and their dependence on bend radius will depend on the specific RIPs employed, on the splice parameters, and on the characteristics of the laser source launched into the first fiber.

Different fiber parameters than those shown in FIG. 2 may be used and still be within the scope of the claimed subject matter. Specifically, different RIPs and core sizes and shapes may be used to facilitate compatibility with different input beam profiles and to enable different output beam characteristics. Example RIPs for the first length of fiber, in addition to the parabolic-index profile shown in FIG. 2, include other graded-index profiles, step-index, pedestal designs (i.e., nested cores with progressively lower refractive indices with increasing distance from the center of the fiber), and designs with nested cores with the same refractive index value but with various NA values for the central core and the surrounding rings. Example RIPs for the second length of fiber, in addition to the profile shown in FIG. 2, include confinement fibers with different numbers of confinement regions, non-uniform confinement-region thicknesses, different and/or non-uniform values for the thicknesses of the rings surrounding the confinement regions, different and/or non-uniform NA values for the confinement regions, different refractive-index values for the high-index and low-index portions of the RIP, non-circular confinement regions (such as elliptical, oval, polygonal, square, rectangular, or combinations thereof), as well as other designs as discussed in further detail with respect to FIGS. 26-28. Furthermore, VBC fiber 200 and other examples of a VBC fiber described herein are not restricted to Use of two fibers. In some examples, implementation may include use of one fiber or more than two fibers. In some cases, the fiber(s) may not be axially uniform; for example, they could include fiber Bragg gratings or long-period gratings, or the diameter could vary along the length of the fiber. In addition, the fibers do not have to be azimuthally symmetric (e.g., the core(s) could have square or polygonal shapes) Various fiber coatings (buffers) may be employed, including high index or index-matched coatings (which strip light at the glass-polymer interface) and low-index coatings (which guide light by total internal reflection at the glass-polymer interface). In some examples, multiple fiber coatings may be used on VBC fiber 200.

FIGS. 11-16 illustrate cross-sectional views of examples of first lengths of fiber for enabling adjustment of beam characteristics in a VBC fiber responsive to perturbation of an optical beam propagating in the first lengths of fiber.

Some examples of beam characteristics that may be adjusted in the first length of fiber are: angular distribution, azimuthal intensify distribution, beam diameter, beam divergence distribution, BPP, beam profile (e.g., Gaussian, flat-top), beam shape, divergence, divergence profile, intensity distribution, luminance, $M^2$ factor, NA, optical intensity profile, optical mode (e.g., filtering), power density profile, radial beam position, radiance, spatial profile distribution, spot shape, spot size, or the like, or any combination thereof. The first lengths of fiber depicted in FIGS. 11-16 and described below are merely examples and do not provide an exhaustive recitation of the variety of first lengths of fiber that may be utilized to enable adjustment of beam characteristics in a VBC fiber assembly. Selection of materials, appropriate RIPs, and other variables for the first lengths of fiber illustrated in FIGS. 11-16 at least depend on a desired beam output. A wide variety of fiber variables are contemplated and are within the scope of the claimed subject matter. Thus, claimed subject matter is not limited by examples provided herein.

Figure 11:
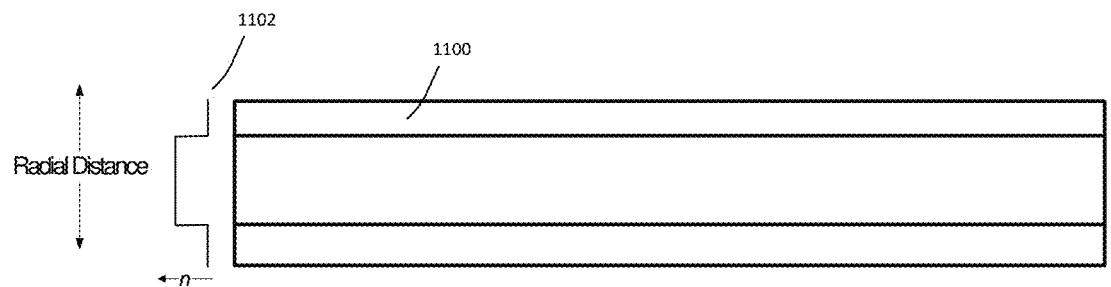
FIGS. 11-16 illustrate cross-sectional views of example first lengthy of fiber for enabling adjustment of beam characteristics in a fiber assembly.
Figure 12:
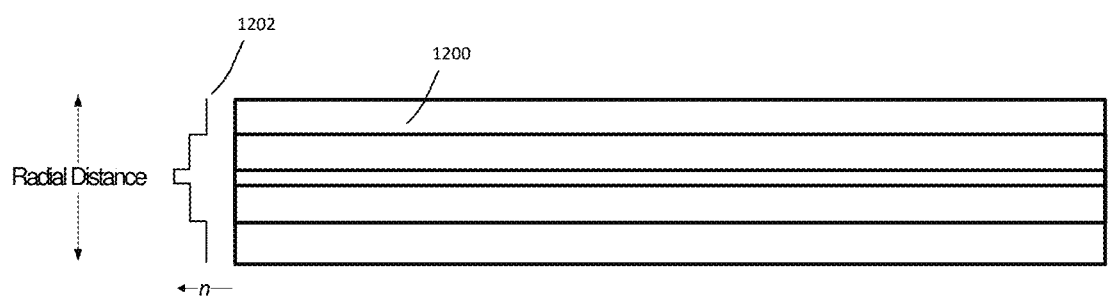
Figure 13:
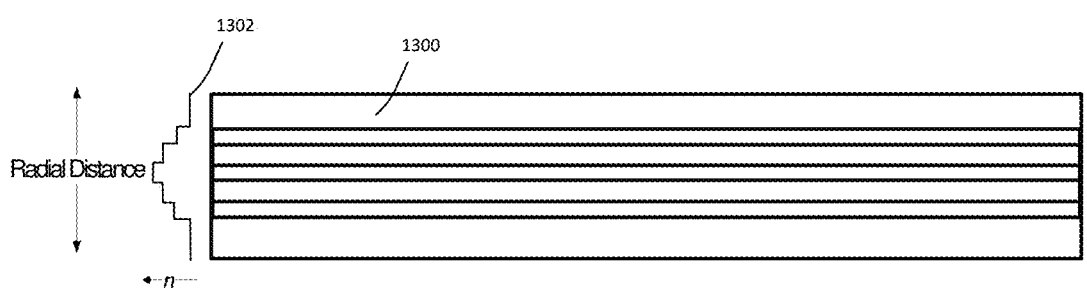

In FIG. 11 first length of fiber 1100 comprises a step-index profile 1102. FIG. 12 illustrates a first length of fiber 1200 comprising a "pedestal RIP" (i.e., a core comprising a step-index region surrounded by a larger step-index region) 1202. FIG. 13 illustrates first length of fiber 1300 comprising a multiple-pedestal RIP 1302.

Figure 14A:
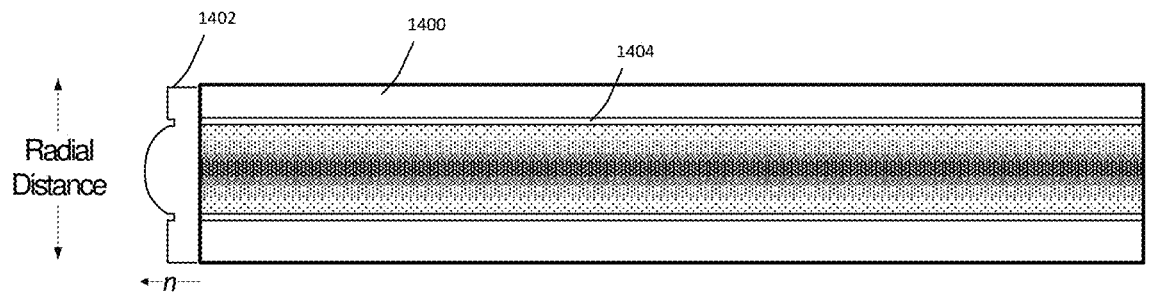

FIG. 14A illustrates first length of fiber 1400 comprising a graded-index profile 1418 surrounded by a down-doped region 1404. When first length of fiber 1400 is perturbed, modes may shift radially outward in first length of fiber 1400 (e.g., during bending of first length of fiber 1400). Graded-index profile 1402 may be designed to promote maintenance or even compression of modal shape. This design may promote adjustment of a beam propagating in first length of fiber 1400 to generate a beam having a beam intensity distribution concentrated in an outer perimeter of the fiber (i.e., in a portion of the fiber core that is displaced from the fiber axis). As described above, when the adjusted beam is coupled into a second length of fiber having confinement regions, the intensity distribution of the adjusted beam may be trapped in the outermost confinement region, providing a donut shaped intensity distribution. A beam spot having a narrow outer confinement region may be useful to enable certain material processing actions.

Figure 14B:
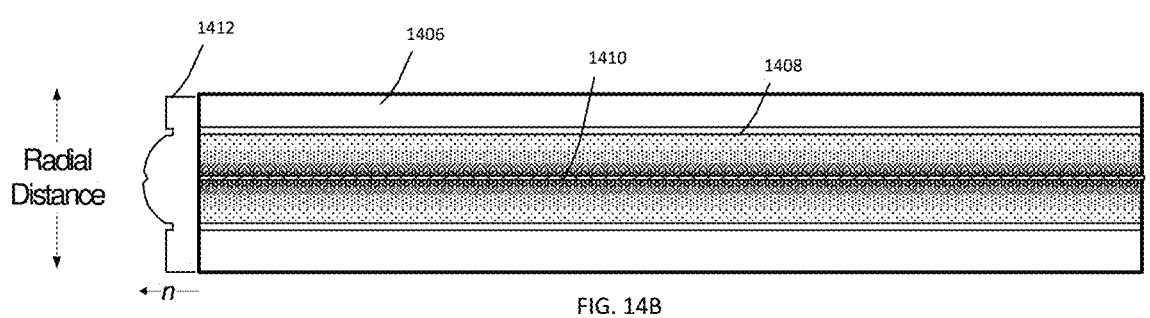

FIG. 14B illustrates first length of fiber 1406 comprising a graded index profile 1414 surrounded by a down-doped region 1408 similar to first length of fiber 1400. However, first length of fiber 1406 includes a divergence structure 1410 (a lower-index region) as can be seen in profile 1412. The divergence structure 1410 is an area of material with a lower refractive index than that of the surrounding core. As the beam is launched into first length of fiber 1406, refraction from divergence structure 1410 causes the beam divergence to increase in first length of fiber 1406. The amount of increased divergence depends on the amount of spatial overlap of the beam with the divergence structure 1410 and the magnitude of the index difference between the divergence structure 1410 and the core material. Divergence structure 1410 can have a variety of shapes, depending on the input divergence distribution and desired output divergence distribution. In an example, divergence structure 1410 has a triangular or graded index shape.

Figure 15:
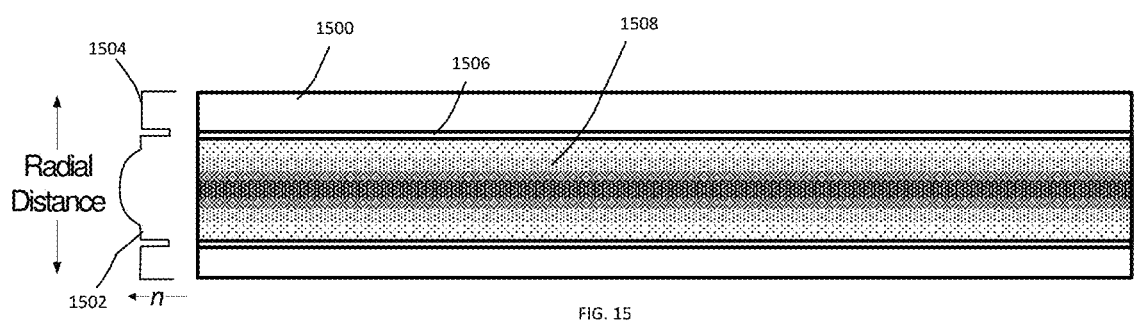

FIG. 15 illustrates a first length of fiber 1500 comprising a parabolic-index central region 1508 surrounded by a constant-index region 1502, and the constant-index region 1502 is surrounded by a lower-index annular layer 1506 and another constant-index region 1504. The lower-index annular layer 1506 helps prude a beam propagating in first length of fiber 1500. When the propagating beam is perturbed, modes shift radially outward in first length of fiber 1500 (e.g., during bending of first length of fiber 1500). As one or more modes shift radially outward, parabolic-index central region 1508 promotes retention of modal shape. When the modes reach the constant-index region of the RIP 1510, they will be compressed against the lower-index annular layer 1506, which may cause preferential excitation of the outermost confinement region in the second fiber (in comparison to the first fiber RIP shown in FIG. 14). in one implementation, this fiber design works with a confinement fiber having a central step-index core and a single annular core. The parabolic-index central region 1508 of the RIP overlaps with the central step-index core of the confinement fiber. The constant-index region 1502 overlaps with the annular core of the confinement fiber. The constant-index region 1502 of the first fiber is intended to make it easier to move the beam into overlap with the annular core by bending. This fiber design also works with other designs of the confinement fiber.

Figure 16:
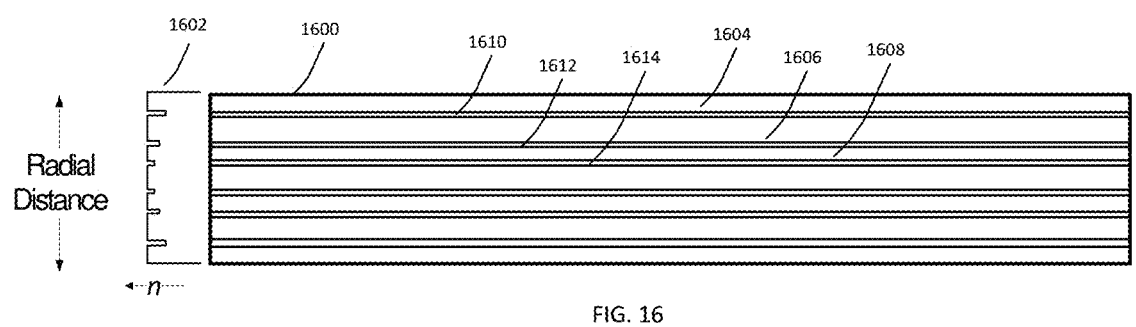

FIG. 16 illustrates a first length of fiber 1600, having RIP 1602, comprising guiding regions, 1604, 1606, 1608, and 1616 bounded by lower-index layers 1610, 1612, and 1614 where the indexes of the lower-index layers 1610, 1612, and 1614 are stepped or, more generally, do not all have the same value. The stepped-index layers may serve to bound the beam intensity to certain guiding regions 1604, 1606, 1608, and/or 1616 when the perturbation assembly 210 (see FIG. 2) acts on the first length of fiber 1600. In this way, adjusted beam light may be trapped in the guiding regions over a range of perturbation actions (such as over a range of bend radii, a range of: bend lengths, a range of micro-bending pressures, and/or a range of acousto-optical signals), allowing for a certain degree of perturbation tolerance before a beam intensity distribution is shifted to a more distant radial position in first length of fiber 1600. Thus, variation in beam characteristics may be controlled in a step-wise fashion. The radial widths of the guiding regions 1604, 1606, 1608, and 1616 may be adjusted to achieve a desired ring width, as may be required by an application. Also, a guiding region can have a thicker radial width to facilitate trapping of a larger fraction of the incoming beam profile if desired. Guiding region 1606 is an example of such a design.

FIGS. 17-21 depict examples of fibers configured to enable maintenance and/or confinement of adjusted beam characteristics in the second length of fiber (e.g., second length of fiber 208). Those fiber designs are referred to as "ring-shaped confinement fibers" because they contain a central core surrounded by annular or ring-shaped cores. These designs are merely examples and not an exhaustive recitation of the variety of fiber RIPs that may be used to enable maintenance and/or confinement of adjusted beam characteristics within a fiber. Thus, claimed subject matter is not limited to the examples provided herein. Moreover, any of the first lengths of fiber described above with respect to FIGS. 11-16 may be combined with any of the second length of fiber described FIGS. 17-21.

Figure 17:
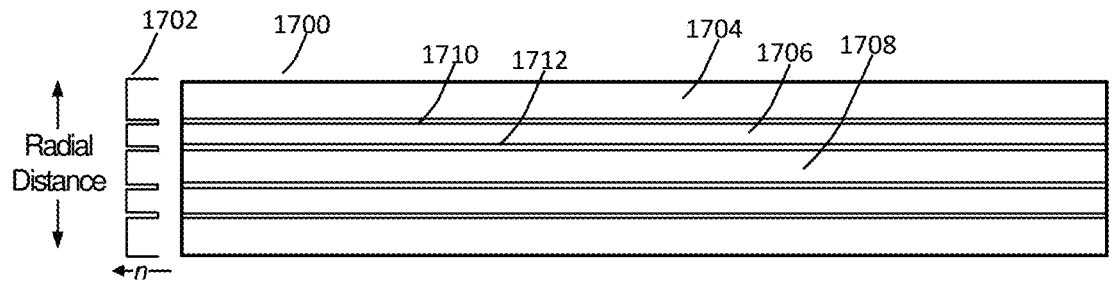
FIGS. 17-19 illustrate cross-sectional views of example second lengths of fiber ("confinement fibers") for confining adjusted beam characteristics in a fiber assembly.

FIG. 17 illustrates a cross-sectional view of an example second length of fiber for maintaining and/or confining adjusted beam characteristics in a VBC fiber assembly. As the perturbed beam is coupled from a first length of fiber to second length of fiber 1700, the second length of fiber 1700 may maintain at least a portion of the beam characteristics adjusted in response to perturbation in the first length of fiber within one or more of confinement regions 1704, 1706, and/or 1708. Second length of fiber 1700 has a RIP 1702. Each of confinement regions 1704, 1706, and/or 1708 is bounded by a lower index layer 1710 and/or 1712. This design enables second length of fiber 1700 to maintain the adjusted beam characteristics. As a result, a beam output by second length of fiber 1700 will substantially maintain the received adjusted beam as modified in the first length of fiber giving the output beam adjusted beam characteristics, which may be customized to a processing task or other application.

Figure 18:
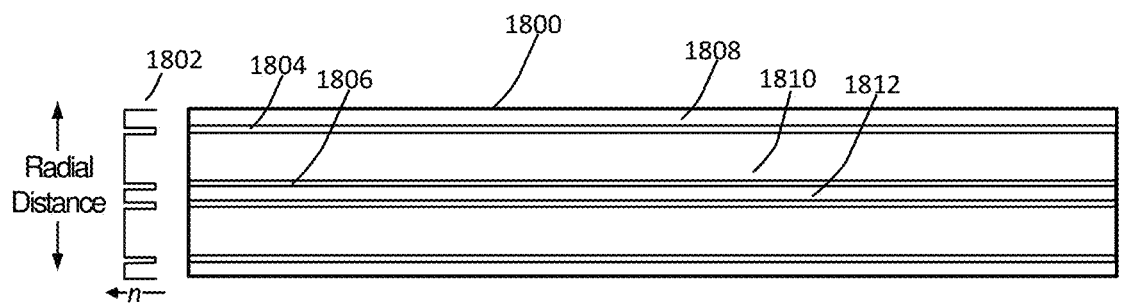

Similarly, FIG. 18 depicts a cross-sectional view of an example second length of fiber 1800 for maintaining and/or confining beam characteristics adjusted in response to perturbation in the first length of fiber in a VBC fiber assembly. Second length of fiber 1800 has a RIP 1802. However, confinement regions 1808, 1810, and/or 1812 have different thicknesses than confinement regions 1704, 1706, and 1708. Each of confinement regions 1808, 1810, and/or 1812 is bounded by a lower index layer 1804 and/or 1806. Varying the thicknesses of the confinement regions (and/or barrier regions) enables tailoring or optimization of a confined adjusted radiance profile by selecting particular radial positions within which to confine an adjusted beam.

Figure 19:
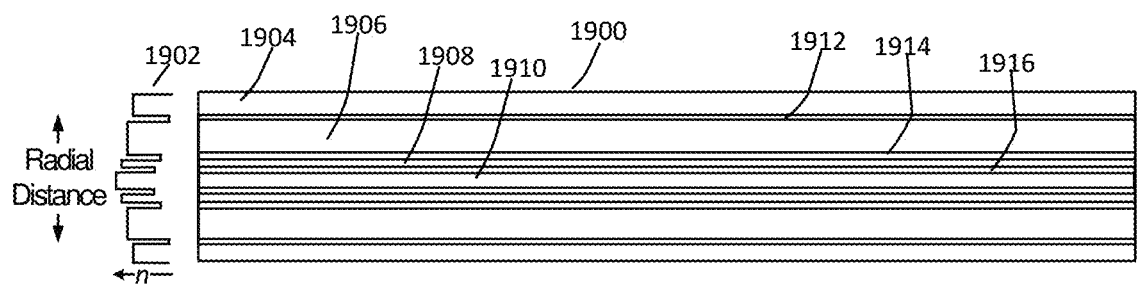

FIG. 19 depicts a cross-sectional view of an example second length of fiber 1900 having a RIP 1902 for maintaining and/or confining an adjusted beam in a VBC fiber assembly configured to provide variable beam characteristics. In this example, the number and thicknesses of confinement regions 1904, 1906, 1908, and 1910 are different from second lengths of fiber 1700 and 1800 and the barrier layers 1912, 1914, and 1916 are of varied thicknesses as well. Furthermore, confinement regions 1904, 1906, 1908, and 1910 have different indexes of refraction and barrier layers 1912, 1914, and 1916 have different indexes of refraction as well. This design may further enable a more granular or optimized tailoring of the confinement and/or maintenance of an adjusted beam radiance to particular radial locations within second length of fiber 1900. As the perturbed beam is launched from a first length of fiber to second length of fiber 1900 the modified beam characteristics of the beam (having an adjusted intensity distribution, radial position, and/or divergence angle, or the like, or a combination thereof) is confined within a specific radius by one or more of confinement regions 1804, 1806, 1808, and/or 1910 of second length of fiber 1900.

As noted previously, the divergence angle of a beam may be conserved or adjusted and then conserved in the second length of fiber. There are a variety of methods to change the divergence angle of a beam. The following are examples of fibers configured to enable adjustment of the divergence angle of a beam propagating from a first length of fiber to a second length of fiber in a fiber assembly for varying beam characteristics. However, these are merely examples and not an exhaustive recitation of the variety of methods that may be used to enable adjustment of divergence of a beam. Thus, claimed subject matter is not limited to the examples provided herein.

Figure 20:
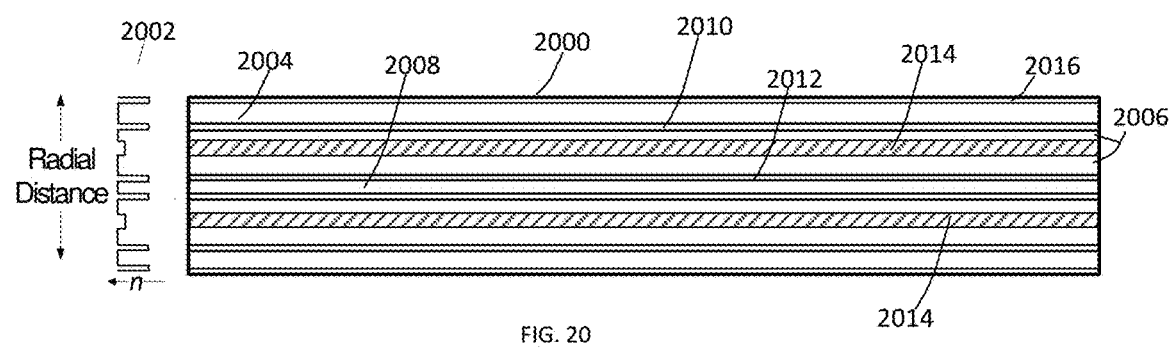
FIGS. 20 and 21 illustrate cross-sectional views of example second lengths of fiber for changing a divergence angle of and confining an adjusted beam in a fiber assembly configured to provide variable beam characteristics.

FIG. 20 depicts a cross-sectional view of an example second length of fiber 2000 having RIP 2002 for modifying, maintaining, and/or confining beam characteristics adjusted in response to perturbation in the first length of fiber. In this example, second length of fiber 2000 is similar to the previously described second lengths of fiber and forms a portion of the VBC fiber assembly for delivering variable beam characteristics as discussed above. There are three confinement regions 2004, 2006, and 2008 and three barrier layers 2010, 2012, and 2016. Second length of fiber 2000 also has a divergence structure 2014 situated within the confinement region 2006. The divergence structure 2014 is an area of material with a lower refractive index than that of the surrounding confinement region. As the beam is launched into second length of fiber 2000, refraction from divergence structure 2014 causes the beam divergence to increase in second length of fiber 2000. The amount of increased divergence depends on the amount of spatial overlaid of the beam with the divergence structure 2014 and the magnitude of the index difference between the divergence structure 2014 and the core material. By adjusting the radial position of the beam near the launch point into the second length of 2000, the divergence distribution may be varied. The adjusted divergence of the beam is conserved in second length of fiber 2000, which is configured to deliver the adjusted beam to the process head, another optical system (e.g., fiber-to-fiber coupler or fiber-to-fiber switch), the work piece, or the like, or any combination thereof. In an example, divergence structure 2014 may have an index dip of about $10^{-5}$-$3 \times 10^{-2}$ with respect to the surrounding material. Other values of the index dip may be employed within the scope of this disclosure and claimed subject matter is not so limited.

Figure 21:
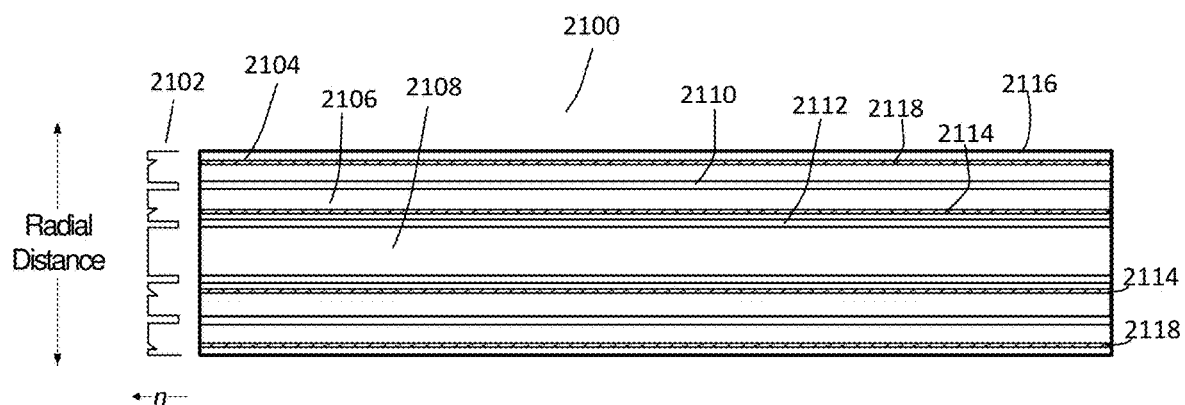

FIG. 21 depicts a cross-sectional view of an example second length of fiber 2100 having a RIP 2102 for modifying, maintaining, and/or confining beam characteristics adjusted in response to perturbation in the first length of fiber. Second length of fiber 2100 forms a portion of a VBC fiber assembly for delivering a beam having variable characteristics. In this example, there are three confinement regions 2104, 2106, and 2108 and three barrier layers 2110, 2112, and 2116. Second length of fiber 2100 also has a plurality of divergence structures 2114 and 2118. The divergence structures 2114 and 2118 are areas of graded lower index material. As the beam is launched from the first length fiber into second length of fiber 2100, refraction from divergence structures 2114 and 2118 causes the beam divergence to increase. The amount of increased divergence depends on the amount of spatial overlap of the beam with the divergence structure and the magnitude of the index difference between the divergence structure 2114 and 2118 and the surrounding core material of confinement regions 2106 and 2104 respectively. By adjusting the radial position of the beam near the launch point into the second length of fiber 2100, the divergence distribution may be varied. The design shown in FIG. 21 allows the intensity distribution and the divergence distribution to be varied somewhat independently by selecting both a particular confinement region and the divergence distribution within that conferment region (because each confinement region may include a divergence structure). The adjusted divergence of the beam is conserved in second length of fiber 2100, which is configured to deliver the adjusted beam to the process head, another optical system, or the work piece. Forming the divergence structures 2114 and 2118 with a graded or non-constant index enables tuning of the divergence profile of the beam propagating in second length of fiber 2100. An adjusted beam characteristic such as a radiance profile and/or divergence profile may be conserved as it is delivered to a process head by the second fiber. Alternatively, an adjusted beam characteristic such as a radiance profile and/or divergence profile may be conserved or further adjusted as it is routed by the second fiber through a fiber-to-fiber coupler ("FFC") and/or fiber-to-fiber switch ("FFS") and to a process fiber, which delivers the beam to the process head or the work piece.

Figure 26:
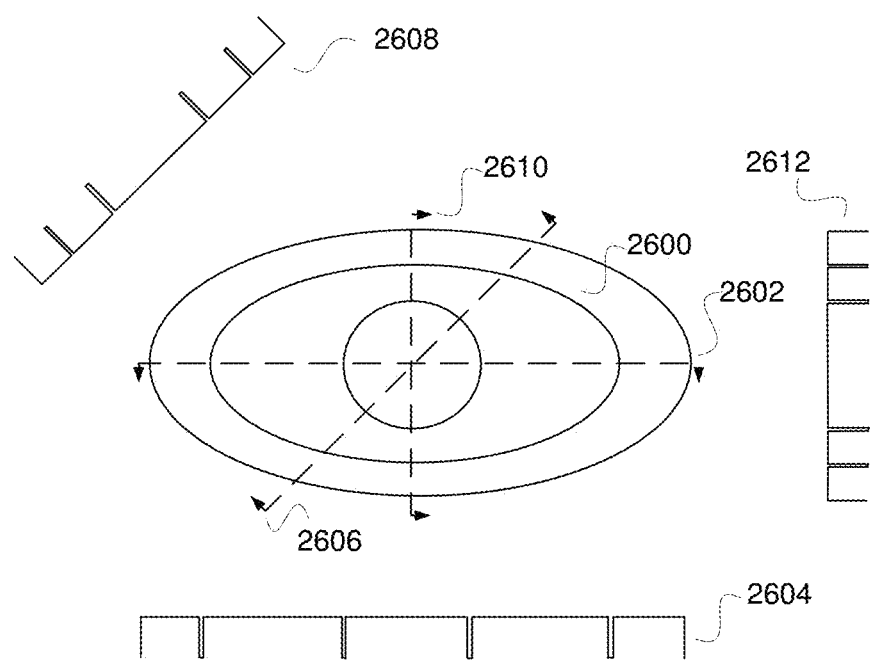
FIGS. 26-28 are cross-sectional views illustrating example second lengths of fiber ("confinement fibers") for confining adjusted beam characteristics in a fiber assembly.
Figure 27:
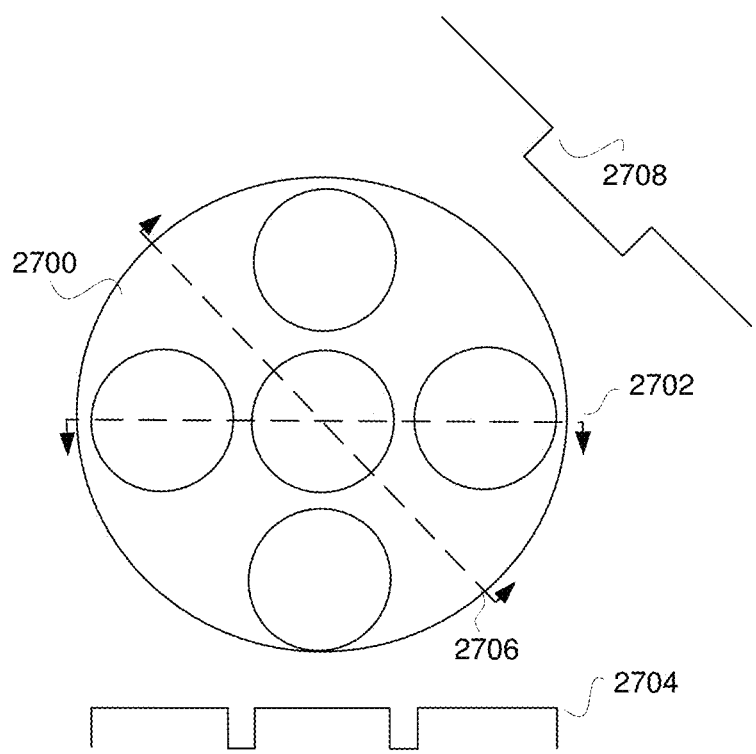
Figure 28:
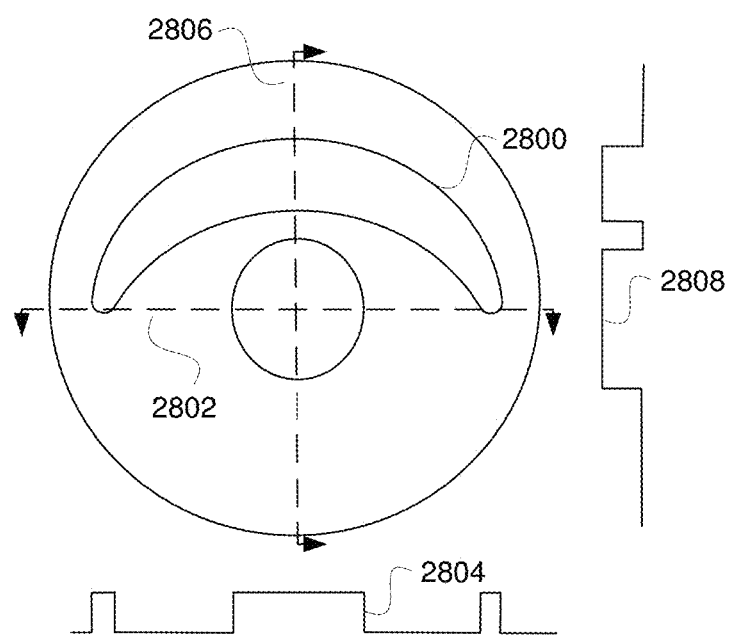

FIGS. 26-28 are cross-sectional views illustrating examples of fibers and fiber RIPs configured to enable maintenance and/or confinement of adjusted beam characteristics of a beam propagating in an azimuthally asymmetric second length of fiber wherein the beam characteristics are adjusted responsive to perturbation of a first length of fiber coupled to the second length of fiber and/or perturbation of the beam by a perturbation device 110. These azimuthally asymmetric designs are merely examples and are not an exhaustive recitation of the variety of fiber RIPs that may be used to enable maintenance and/or confinement of adjusted beam characteristics within an azimuthally asymmetric fiber. Thus, claimed subject matter is not limited to the examples provided herein. Moreover, any of a variety of first lengths of fiber (e.g., like those described above) may be combined with any azimuthally asymmetric second length of fiber (e.g., like those described in FIGS. 26-28).

FIG. 26 illustrates RIPs at various azimuthal angles of a cross-section through an elliptical fiber 2600. At a first azimuthal angle 2602, elliptical fiber 2600 has a first RIP 2604. At a second azimuthal angle 2606 that is rotated 45° from first azimuthal angle 2602, elliptical fiber 2600 has a second RIP 2808. At a third azimuthal angle 2610 that is rotated another 45° from second azimuthal angle 2606, elliptical fiber 2600 has a third RIP 2612, First, second, and third RIPS 2604, 2608, and 2612 are all different.

FIG. 27 illustrates RIPs at various azimuthal angles of a cross-section through a multicore fiber 2700. At a first azimuthal angle 2702, multicore fiber 2700 has a first RIP 2704. At a second azimuthal angle 2706, multicore fiber 2700 has a second RIP 2708. First and second RIPs 2704 and 2708 are different. In an example, perturbation device 110 may act in multiple planes in order to launch the adjusted beam into different regions of an azimuthally asymmetric second fiber.

FIG. 28 illustrates RIPs at various azimuthal angles of a cross-section through a fiber 2800 having at least one crescent shaped core. In some cases, the corners of the crescent may be rounded, flattened, or otherwise shaped, which may minimize optical loss. At a first azimuthal angle 2802, fiber 2800 has a first RIP 2804. At a second azimuthal angle 2808, fiber 2800 has a second RIP 2808. First and second RIPs 2804 and 2808 are different.

Figure 22A:
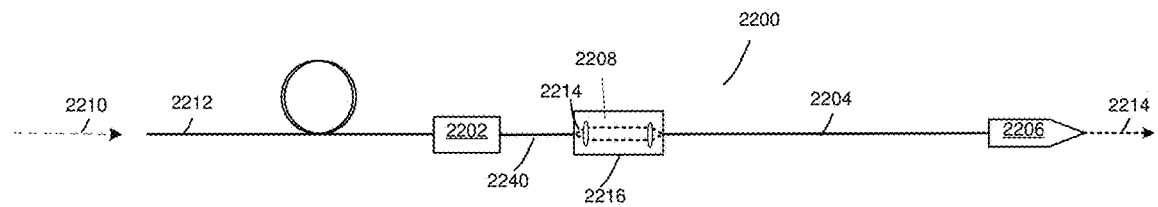
FIG. 22A illustrates an example laser system including a fiber assembly configured to provide variable beam characteristics disposed between a feeding fiber and process head.

FIG. 22A illustrates an example of a laser system 2200 including a VBC fiber assembly 2202 configured to provide variable beam characteristics. VBC fiber assembly 2202 comprises a first length of fiber 104, second length of fiber 108, and a perturbation device 110. VBC fiber assembly 2202 is disposed between feeding fiber 2212 (i.e., the output fiber from the laser source) and VBC delivery fiber 2240. VBC delivery fiber 2240 may comprise second length of fiber 108 or an extension of second length of fiber 108 that modifies, maintains, and/or confines adjusted beam characteristics. Beam 2210 is coupled into VBC fiber assembly 2202 via feeding fiber 2212. VBC Fiber assembly 2202 is configured to vary the characteristics of beam 2210 in accordance with the various examples described above. The output of VBC fiber assembly 2202 is adjusted beam 2214 which is coupled into VBC delivery fiber 2240. VBC delivery fiber 2240 delivers adjusted beam 2214 to free-space optics assembly 2208, which then couples adjusted beam 2214 into a process fiber 2204. Adjusted beam 2214 is then delivered to process head 2206 by process fiber 2204. The process head can include guided wave optics (such as fibers and fiber coupler), free space optics such as lenses, mirrors, optical filters, diffraction gratings), beam scan assemblies such as galvanometer scanners, polygonal mirror scanners, or other scanning systems that are used to shape the adjusted beam 2214 and deliver the shaped beam to a workpiece.

In laser system 2200, one or more of the free-space optics of free-space optics assembly 2208 may be disposed in an FFC or other beam coupler 2216 to perform a variety of optical manipulations of an adjusted beam 2214 (represented in FIG. 22A with different dashing than beam 2210). For example, tree-space optics assembly 2208 may preserve the adjusted beam characteristics of adjusted beam 2214. Process fiber 2204 may have the same RIP as VBC delivery fiber 2240. Thus, the adjusted beam characteristics of adjusted beam 2214 may be preserved all the way to process head 2206. Process fiber 2204 may comprise a RIP similar to any of the second lengths of fiber described above, including confinement regions.

Figure 22B:
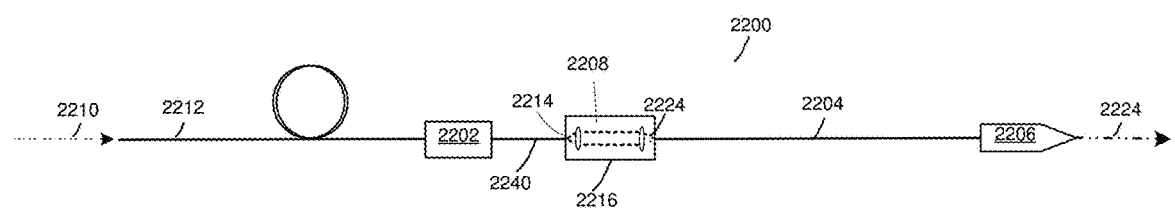
FIG. 22B illustrates an example it system including a fiber assembly configured to provide variable beam characteristics disposed between a feeding fiber and process head.

Alternatively, as illustrated in FIG. 22B, free-space optics assembly 2208 may change the adjusted beam characteristics of adjusted beam 2214 by, for example, increasing or decreasing the divergence, the beam diameter, and/or the spot size of adjusted beam 2214 (e.g., by magnifying or demagnifying adjusted beam 2214) and/or otherwise further modifying adjusted beam 2214. Furthermore, process fiber 2204 may have a different RIP than VBC delivery fiber 2240. Accordingly, the RIP of process fiber 2204 may be selected to preserve additional adjustment of adjusted beam 2214 made by the free-space optics of free-space optics assembly 2208 to generate a twice adjusted beam 2224 (represented in FIG. 22B with different dashing than adjusted beam 2214).

Figure 23:
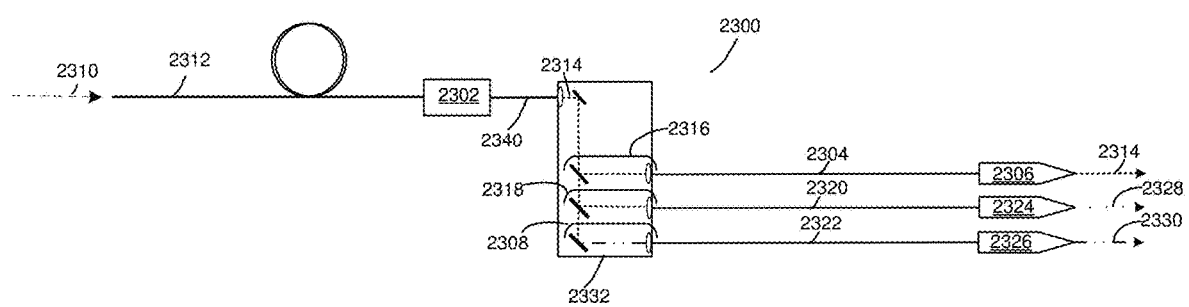
FIG. 23 illustrates an example laser system including a fiber assembly configured to provide variable beam characteristics disposed between a feeding fiber and multiple process fibers.

FIG. 23 illustrates an example of a laser system 2300 including VBC fiber assembly 2302 disposed between feeding fiber 2312 and VBC delivery fiber 2340. During operation, beam 2310 is coupled into VBC fiber assembly 2302 via feeding fiber 2312. VBC Fiber assembly 2302 includes first length of fiber 104, second length of fiber 108, and a perturbation device 110 and is configured to vary characteristics of beam 2310 in accordance with the various examples described above. VBC Fiber assembly 2302 generates adjusted beam 2314 output by VBC delivery fiber 2340. VBC delivery fiber 2340 comprises a second length of fiber 108 of fiber for modifying, maintaining, and/or confining adjusted beam characteristics in a VBC fiber assembly 2302 in accordance with the various examples described above (see FIGS. 17-21, for example), VBC delivery fiber 2340 couples adjusted beam 2314 into beam switch ("FFS") 2332, which then couples its various output beams to one or more of multiple process fibers 2304, 2320, and 2322. Process fibers 2304, 2320, and 2322 deliver adjusted beams 2314, 2328, and 2330 to respective process heads 2306, 2324. and 2326.

In an example, beam switch 2332 includes one or more sets of free-space optics 2308, 2316, and 2318 configured to perform a variety of optical manipulations of adjusted beam 2314. Free-space optics 2308, 2316, and 2318 may preserve or vary adjusted beam characteristics of adjusted beam 2314. Thus, adjusted beam 2314 may be maintained by the free-space optics or adjusted further. Process fibers 2304, 2320, and 2322 may have the same or a different RIP as VBC delivery fiber 2340, depending on whether it is desirable to preserve or further modify a beam passing from the free-space optics assemblies 2308, 2316, and 2318 to respective process fibers 2304, 2320, and 2322. In other examples, one or more beam portions of beam 2310 are coupled to a workpiece without adjustment, or different beam portions are coupled to respective VBC fiber assemblies so that beam portions associated with a plurality of beam characteristics can be provided for simultaneous workpiece processing. Alternatively, beam 2310 can be switched to one or more of a set of VBC fiber assemblies.

Routing adjusted beam 2314 through any of free-space optics assemblies 2308, 2316, and 2318 enables delivery of a variety of additionally adjusted beams to process heads 2306, 2324, and 2326. Therefore, laser system 2300 provides additional degrees of freedom for varying the characteristics of a beam, as well as switching the beam between process heads ("time sharing") and/or delivering the beam to multiple process heads simultaneously ("power sharing").

For example, free-space optics in beam switch 2332 may direct adjusted beam 2314 to free-space optics 2316 configured to preserve the adjusted characteristics of adjusted beam 2314. Process fiber 2304 may have the same RIP as VBC delivery fiber 2340. Thus, the beam delivered to process head 2306 will be a preserved adjusted beam 2314.

In another example, beam switch 2332 may direct adjusted beam 2314 ta free-space optics 2318 configured to preserve the adjusted characteristics of adjusted beam 2314. Process fiber 2320 may have a different RIP than VBC delivery fiber 2340 and may be configured with divergence altering structures as described with respect to FIGS. 20 and 21 to provide additional adjustments to the divergence distribution of adjusted beam 2314. Thus, the beam delivered to process head 2324 will be a twice adjusted beam 2328 having a different beam divergence profile than adjusted, beam 2314.

Process fibers 2304, 2320, and/or 2322 may comprise a RIP similar to any of the second lengths of fiber described above, including confinement regions or a wide variety of other RIPs, and claimed subject matter is not limited in this regard.

In yet another example, free-space optics beam switch 2332 may direct adjusted beam 2314 to free-space optics 2308 configured to change the beam characteristics of adjusted beam 2314. Process fiber 2322 may have a different RIP than VBC delivery fiber 2340 and may be configured to preserve (or alternatively further modify) the new further adjusted characteristics of adjusted beam 2314. Thus, the beam delivered to process head 2326 will be a twice adjusted beam 2330 having different beam characteristics (due to the adjusted divergence profile and/or intensity profile) than adjusted beam 2314.

In FIGS. 22A, 22B, and 23, the optics in the FFC or FFS may adjust the spatial profile and/or divergence profile by magnifying or demagnifying the adjusted beam 2214 before launching into the process fiber. They may also adjust the spatial profile and/or divergence profile via other optional transformations. They may also adjust the launch position into the process fiber. These methods may be used alone or in combination.

FIGS. 22A, 22B, and 23 merely provide examples of combinations of adjustments to beam characteristics using free-space optics and various combinations of fiber RIPs to preserve or modify adjusted beams 2214 and 2314. The examples provided above are not exhaustive and are meant for illustrative purposes only. Thus, claimed subject matter is not limited in this regard.

Figure 24:
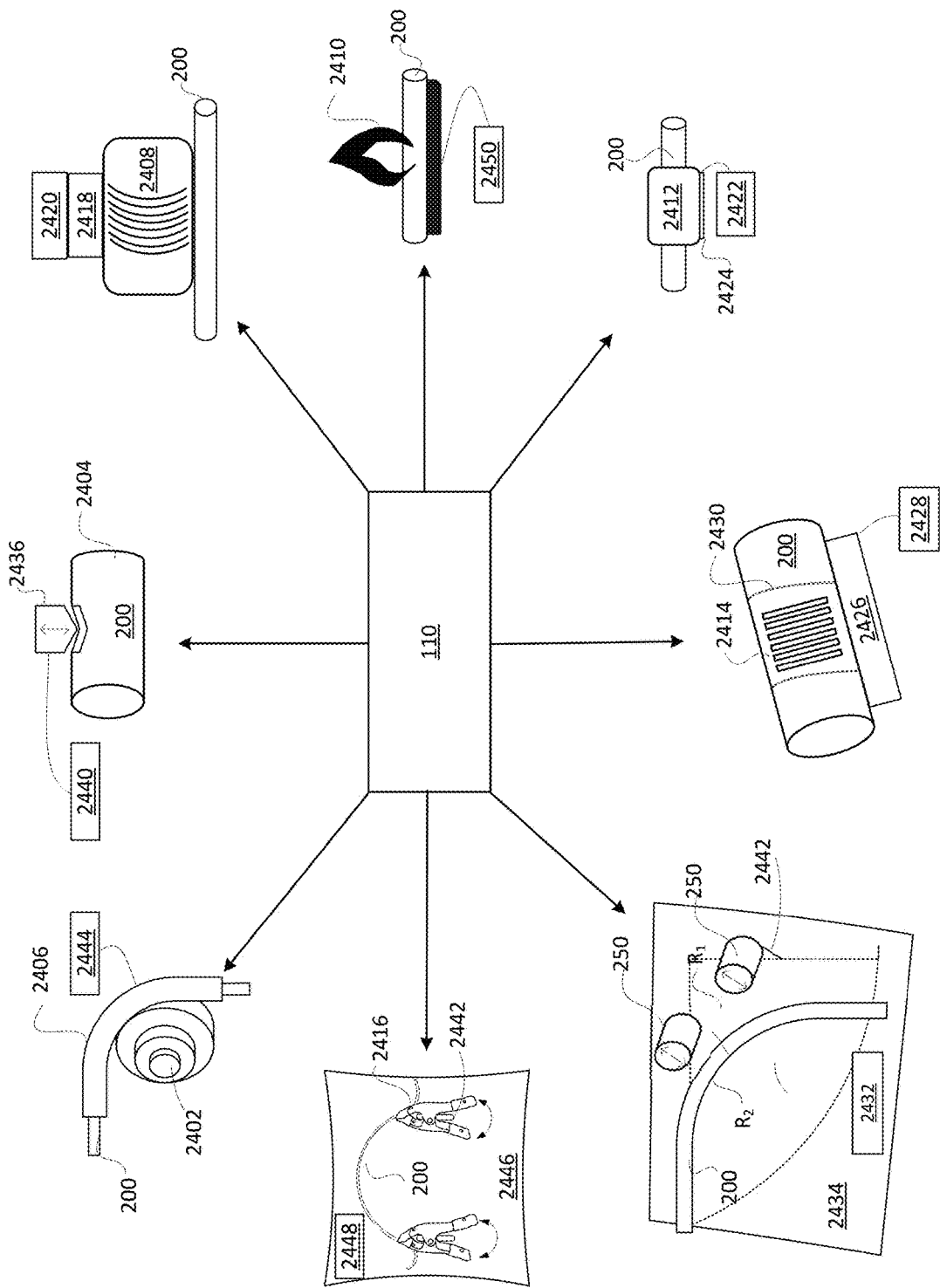
FIG. 24 illustrates examples of various perturbation assemblies for providing variable beam characteristics according to various examples provided herein.

FIG. 24 illustrates various examples of perturbation devices, assemblies, or methods (for simplicity referred to collectively herein as "perturbation device 110") for perturbing a VBC fiber 200 and/or an optical beam propagating in VBC fiber 200 according to various examples provided herein. Perturbation device 110 may be any of a variety of devices, methods, and/or assemblies configured to enable adjustment of beam characteristics of a beam propagating in VBC fiber 200. In an example, perturbation device 110 may be a mandrel 2402, a micro-bend 2404 in the VBC fiber 200, flexible tubing 2406, an acousto-optic transducer 2408, a thermal device 2410, a piezoelectric device 2412 (e.g., transducer), a grating 2414, a clamp 2416 (or other fastener), a mandrel-roller combination 2432, or the like, or any combination thereof. These are merely examples of perturbation devices 110 and not an exhaustive listing of perturbation devices 110, and claimed subject matter is not limited in this regard.

Mandrel 2402 may be used to perturb VBC fiber 200 by providing a form about which VBC fiber 200 may be bent. As discussed above, reducing the bend radius of VBC fiber 200 moves the intensity distribution of the beam radially outward. In some examples, mandrel 2402 may be stepped or conically shaped to provide discrete bend radii levels. Alternatively, mandrel 2402 may comprise a cone shape without steps to provide continuous bend radii for more granular control of the bend radius. The radius of curvature of mandrel 2402 may be constant (e.g., a cylindrical form) or non-constant (e.g., an oval-shaped form). Similarly, flexible tubing 2406, clamps 2416 (or other varieties of fasteners), or rollers 250 may be used to guide and control the bending of VBC fiber 200 about mandrel 2402. Furthermore, changing the length over which the fiber is bent at a particular bend radius also may modify the intensity distribution of the beam. VBC fiber 200 and mandrel 2402 may be configured to change the intensity distribution within the first fiber predictably (e.g., in proportion to the length over which the fiber is bent and/or the bend radius), Rollers 250 may move up and down along a track 2442 on platform 2434 to change the bend radius of VBC fiber 200.

Clamps 2416 (or other fasteners) may be used to guide and control the bending of VBC fiber 200 with or without a mandrel 2402. Clamps 2416 may move up and down along a track 2442 or platform 2446. Clamps 2416 may also swivel to change bend radius, tension, or direction of VBC fiber 200. Controller 2448 may control the movement of clamps 2416.

In another example, perturbation device 110 may be flexible tubing 2406 and may guide bending of VBC fiber 200 with or without a mandrel 2402. Flexible tubing 2406 may encase VBC fiber 200. Flexible tubing 2406 may be made of a variety of materials and may be manipulated using piezoelectric transducers controlled by controller 2444. In another example, clamps or other fasteners may be used to move flexible tubing 2406.

Micro-bend 2404 in VBC fiber 200 is a local perturbation caused by lateral mechanical stress on the fiber. Micro-bending can cause mode coupling and/or transitions from one confinement region to another confinement region within a fiber, resulting in varied beam characteristics of the beam propagating in a VBC fiber 200. Mechanical stress may be applied by an actuator 2436 that is controlled by controller 2440. However, this is merely an example of a method for inducing mechanical stress VBC fiber 200 and claimed subject matter is not limited in this regard.

Acousto-optic transducer ("AOT") 2408 may be used to induce perturbation of a beam propagating in the VBC fiber 200 using an acoustic wave. The perturbation is caused by the modification of the refractive index of the fiber by the oscillating mechanical pressure of art acoustic wave. The period and strength of the acoustic wave are related to the acoustic wave frequency and amplitude, allowing dynamic control of the acoustic perturbation. Thus, a perturbation device 110 including AOT 2408 may be configured to vary the beam characteristics of a beam propagating in the fiber. In an example, piezoelectric transducer 2418 may create the acoustic wave and may be controlled by controller or driver 2420. The acoustic wave induced in AOT 2408 may be modulated to change and/or control the beam characteristics of the optical beam in VBC fiber 200 in real-time. However, this is merely an example of a method for creating and controlling a AOT 2408 and claimed subject matter is not limited in this regard.

Thermal device 2410 may be used to induce perturbation of a beam propagating in VBC fiber 200 using heat. The perturbation is caused by the modification of the RIP of the fiber induced by heat. Perturbation may be dynamically controlled by controlling an amount of heat transferred to the fiber and the length over which the heat is applied. Thus, a perturbation device 110 including thermal device 2410 may be configured to vary a range of beam characteristics. Thermal device 2410 may be controlled by controller 2450.

Piezoelectric device 2412 may be used to induce perturbation of a beam propagating in a VBC fiber using piezoelectric action. The perturbation is caused by the modification of the RIP of the fiber induced by a piezoelectric material attached to the fiber. The piezoelectric material in the form of a jacket around the bare fiber may apply tension or compression to the fiber, modifying its refractive index via the resulting changes in density. Perturbation may be dynamically controlled by controlling a voltage to the piezoelectric device 2412. Thus, a perturbation device 110 including piezoelectric device 2412 may be configured to vary the beam characteristics over a particular range.

In an example, piezoelectric device 2412 may be configured to displace VBC fiber 200 in a variety of directions (e.g., axially, radially, and/or laterally) depending on a variety of factors, including how the piezoelectric device 2412 is attached to VBC fiber 200, the direction of the polarization of the piezoelectric materials, the applied voltage. etc. Additionally, bending of VBC fiber 200 is possible using the piezoelectric device 2412. For example, driving a length of piezoelectric material having multiple segments comprising opposing electrodes can cause a piezoelectric device 2412 to bend in a lateral direction. Voltage applied to piezoelectric device 2412 by electrode 2424 may be controlled by controller 2422 to control displacement of VBC fiber 200. Displacement may be modulated to change and/or control the beam characteristics of the optical beam in VBC fiber 200 in real-time. However, this is merely an example of a method of controlling displacement of a VBC fiber 200 using a piezoelectric device 2412 and claimed subject matter is not limited in this regard.

Gratings 2414 may be used to induce perturbation of a beam propagating in a VBC fiber 200. A grating 2414 can be written into a fiber by inscribing a periodic variation of the refractive index into the core. Gratings 2414 such as fiber Bragg gratings can operate as optical filters or as reflectors. A long-period grating can induce transitions among co-propagating fiber modes. The radiance, intensity profile, and/or divergence profile of a beam comprised of one or more modes can thus be adjusted using a long period grating to couple one or more of the original modes to one or more different modes having different radiance and/or divergence profiles. Adjustment is achieved by varying the periodicity or amplitude of the refractive index grating. Methods such as varying the temperature, bend radius, and/or length (e.g., stretching) of the fiber Bragg grating can be used for such adjustment. VBC fiber 200 having gratings 2414 may be coupled to stage 2426. Stage 2426 may be configured to execute any of a variety of functions and may be controlled by controller 2428. For example, stage 2426 may he coupled to VBC fiber 200 with fasteners 2430 and may be configured to stretch and/or bend VBC fiber 200 using fasteners 2430 for leverage. Stage 2426 may have an embedded thermal device and may change the temperature of VBC fiber 200.

Figure 25:
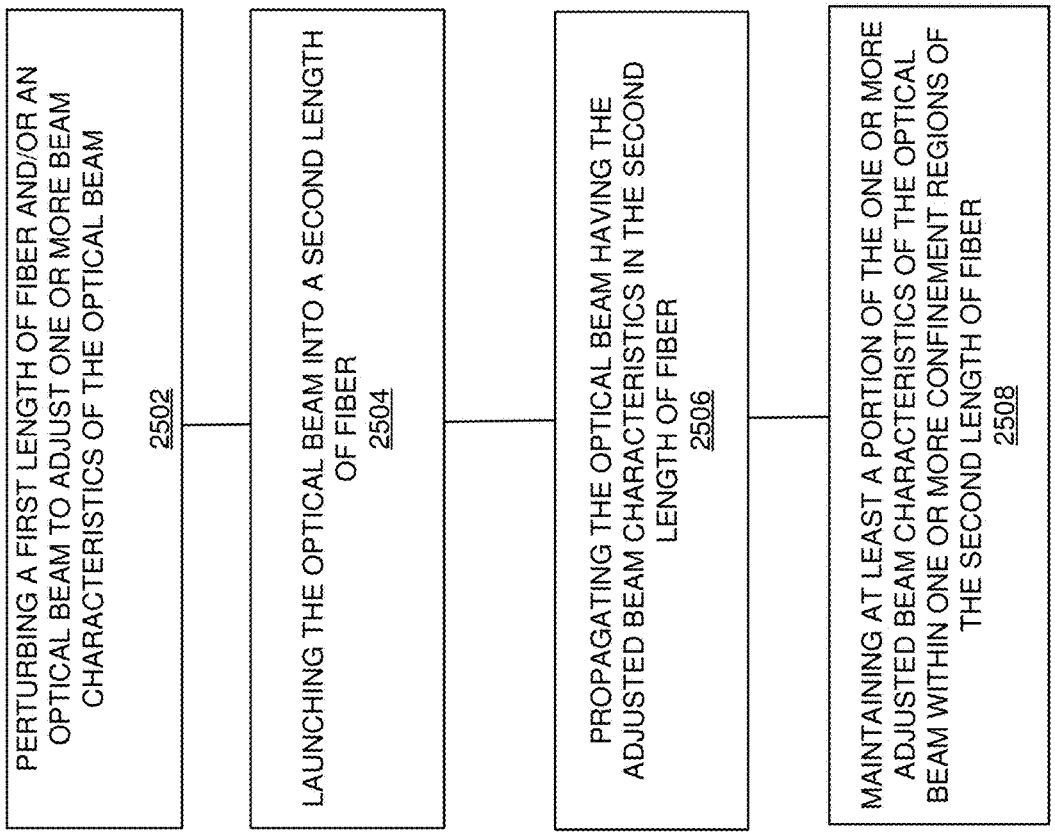
FIG. 25 illustrates an example process for adjusting and maintaining modified characteristics of an optical beam.

FIG. 25 illustrates an example process 2500 for adjusting and/or maintaining beam characteristics within a fiber without the use of free-space optics to adjust the beam characteristics. In bock 2502, a first length of fiber and/or an optical beam are perturbed to adjust one or more optical beam characteristics. Process 2500 moves to block 2504, where the optical beam is launched into a second length of fiber. Process 2500 moves to block 2506, where the optical beam having the adjusted beam characteristics is propagated in the second length of fiber. Process 2500 moves to block 2508, where at least a portion of the one or more beam characteristics of the optical beam are maintained within one or more confinement regions of the second length of fiber. The first and second lengths of fiber may he comprised of the same fiber, or they may be different fibers.

Systems for Processing Using Adjustable Beam Characteristics

A system for processing can comprise, for example, VBC fiber 100, including first length of fiber 104 and second length of fiber 108, and perturbation device 110 in order to control one or more beam characteristics of optical beam 102, per FIG. 1. Such a system for processing can comprise, for example, VBC fiber 200, including first length of fiber 204 and second length of fiber 208, and perturbation device 210 in order to control one or more beam characteristics of optical beam 202, per FIG. 2.

Such a system tor processing can comprise, for example, first length of fiber 1100, per FIG. 11; first length of fiber 2100, per FIG. 12; first length of fiber 1300, per FIG. 13; first length of fiber 1400, per FIG. 14A; first length of fiber 1406, per FIG. 14B; first length of fiber 1500, per FIG. 15; or first length of fiber 1600, per FIG. 16.

Such a system for processing can comprise, for example, second length of fiber 1700, per FIG. 17; second length of fiber 1800, per FIG. 18; second length of fiber 1900, per FIG. 19; second length of fiber 2000, per FIG. 20; or second length of fiber 2100, per FIG. 21.

In some examples, a first length of fiber, a second length of fiber, and a perturbation device can be combined in a fiber assembly, such as VBC fiber assembly 2202, per FIG. 22A or FIG. 22B; or VBC fiber assembly 2302, per FIG. 23.

A perturbation device (e.g., perturbation device 110) can be configured to modify one or more beam characteristics of optical beam (e.g., optical beam 102), during processing, in the first length of fiber (e.g., first length of fiber 104), the second length of fiber (e.g., second length of fiber 108), or in the first and second lengths of fiber.

In some examples, the perturbation device (e.g., perturbation device 110) can modify one or more beam characteristics of an optical beam (e.g., optical beam 102). The modified one or more beam characteristics can include, for example, one or more of angular distribution, azimuthal intensity distribution, beam diameter, beam profile (e.g., Gaussian, flat-top), beam shape, divergence, divergence profile, divergence distribution, BPP, intensity distribution, luminance, $M^2$ factor, NA, optical intensity, optical mode (e.g., filtering), power density, radial beam position, radiance, spatial profile distribution, spot shape, or spot size, or any combination thereof.

In some examples, the perturbing effectuated by the perturbation device (e, g., perturbation device 110) can include one or more of bending, bending over a particular length, micro-bending, applying acousto-optic excitation, thermal perturbation, stretching, applying piezoelectric perturbation, applying damps (or other fasteners), using a grating, or any combination thereof. FIG. 24 illustrates various examples of such perturbation devices.

Such a system for processing can further comprise, for example, one or more optical beam sources configured to generate optical beams, such as laser beams associated with fiber-coupled lasers (e.g., disk lasers, diode lasers, fiber lasers, YAG lasers), per FIGS. 22A, 22B, and/or 23.

Such a system for processing can further comprise, for example, one or more beam couplers, beam switches, free-space optics assemblies, process heads, or any combination thereof. In some examples, characteristics of an adjusted beam (e.g., adjusted beam 2214) from a VBC fiber assembly (e.g., VBC fiber assembly 2202) can be preserved in a delivery fiber (e.g., VBC delivery fiber 2240), free-space optics assembly (e.g., free-space optics assembly 2208), process fiber (e.g., process fiber 2204), and/or process head (process head 2206), per FIG. 22A. In some examples, characteristics of an adjusted beam (e.g., adjusted beam 2214) from a VBC fiber assembly (e.g., VBC fiber assembly 2202) can be preserved in a delivery fiber (e.g., VBC delivery fiber 2240), but then further modified in a free-space optics assembly (e.g., free-space optics assembly 2208), and then the twice-adjusted beam 2224 can be preserved in a process fiber (e.g., process fiber 2204) and/or process head (process head 2206), per FIG. 22B. In some examples, characteristics of an adjusted beam (e.g., adjusted beam 2314) from a VBC fiber assembly (e.g., VBC fiber assembly 2302) can be preserved in a delivery fiber (e.g., VBC delivery fiber 2340), but then switched using a beam switch (e.g., beam switch 2332) and preserved or further modified in one or more free-space optics assemblies (e.g., free-space optics assemblies 2308, 2316, 2318), and then the once-or-twice-adjusted beams can be preserved in one or more process fibers (e.g., process fiber 2304, 2320, 2322) and/or one or more process heads (e.g., process head 2306, 2324, 2326), per FIG. 23. Such a system provides for options such as power sharing and time sharing as discussed.

Methods of Processing Using Adjustable Beam Characteristics

Figure 29:
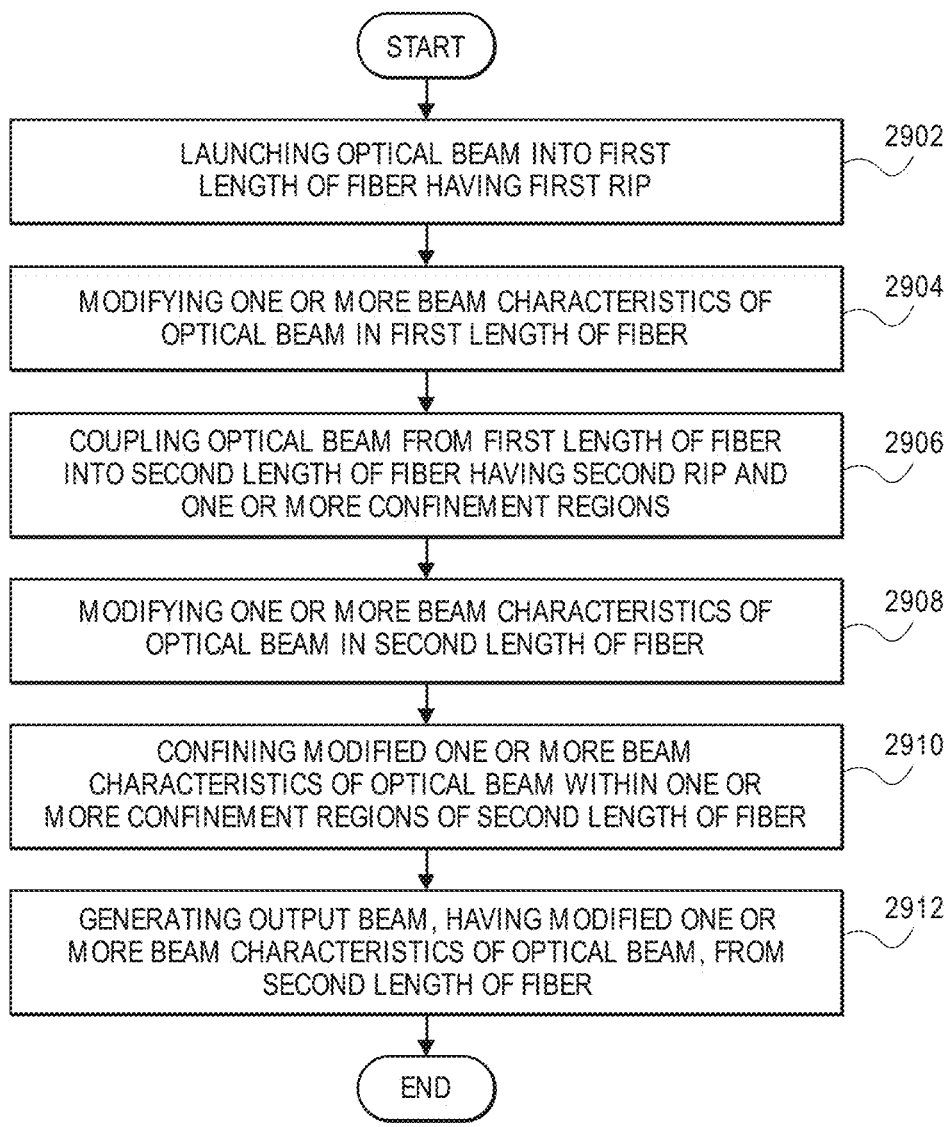
FIG. 29 depicts a first example method of processing by controlling one or more beam characteristics of an optical beam.

FIG. 29 depicts a first example method of processing by controlling one or more beam characteristics of an optical beam. In some examples, the processing can include additive processing and/or manufacture of a product. In some examples, the processing can include one or more of ablating, cladding, cutting, drilling, engraving, glazing, heat-treating, marking, patterning, roughening, smoothing, surface texturing, trepanning, and/or welding, or any combination thereof.

In block 2902, the optical beam is launched into a first length of fiber having a first RIP. In block 2904, one or more beam characteristics of the optical beam can be modified in the first length of fiber. Such modified beam characteristics can include, for example, angular distribution, azimuthal intensity distribution, beam diameter, beam divergence distribution, BPP, beam profile (e.g., Gaussian, flat-top), beam shape, divergence, divergence profile, intensity distribution, luminance, $M^2$ factor, NA, optical intensity profile, optical mode (e.g., filtering), power density profile, radial beam position, radiance, spatial profile distribution, spot shape, spot size, or the like, or any combination thereof. In some examples, the one or more beam characteristics of the optical beam can be modified in the first length of fiber (block 2904), in the second length of fiber (block 2908), or in the first and second lengths of fiber (blocks 2904 and 2908).

In block 2906, the optical beam is coupled from the first length of fiber into a second length of fiber having a second RIP and one or more confinement regions. In some examples, when the second length of fiber has one confinement region, the first RIP can differ from the second RIP; but when the second length of fiber has two or more confinement regions, the first RIP can be the same as or differ from the second RIP.

In block 2908, the one or more beam characteristics of the optical beam can be modified in the second length of fiber. Such modified beam characteristics can include, for example, azimuthal intensity distribution. In some examples, the one or more beam characteristics of the optical beam can be modified in the first length of fiber (block 2904), in the second length of fiber (block 2908), or in the first and second lengths of fiber (blocks 2904 and 2908).

In block 2910, the modified one or more beam characteristics of the optical beam are confined within the one or more confinement regions of the second length of fiber. In block 2912, an output beam, having the modified one or more beam characteristics of the optical beam, is generated from the second length of fiber.

Figure 30:
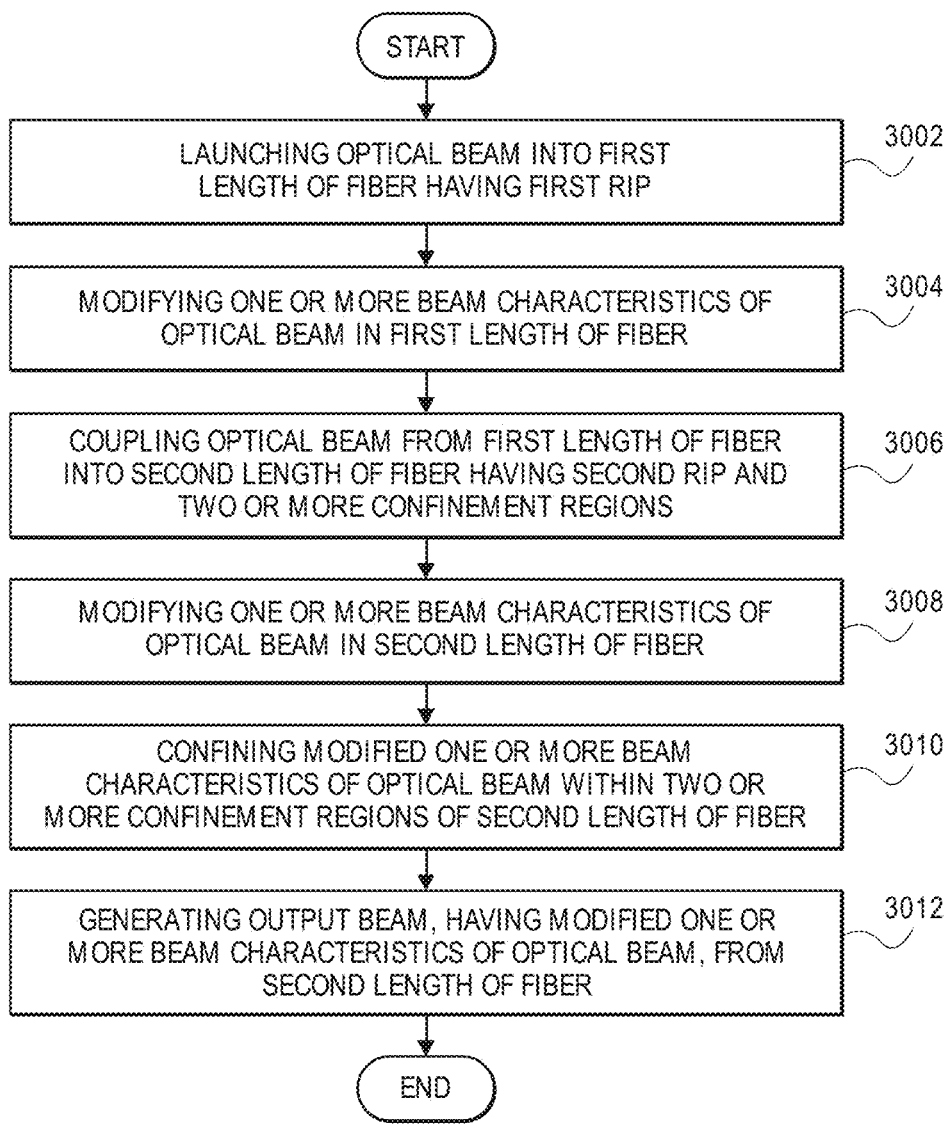
FIG. 30 depicts a second example method of processing by controlling one or more beam characteristics of an optical beam.

Similarly, FIG. 30 depicts a second example method of processing by controlling one or more beam characteristics of an optical beam. In some examples, the processing can include additive processing and/or manufacture of a product. In some examples, the process can include one or more of ablating, cladding, cutting, drifting, engraving, glazing, heat-treating, marking, patterning, roughening, smoothing, surface texturing, trepanning, and/or welding, or any combination thereof.

In block 3002, the optical beam is launched into a first length of fiber having a first RIP. In block 3004, one or more beam characteristics of the optical beam can be modified in the first length of fiber. Such modified beam characteristics can include, for example, angular distribution, azimuthal intensity distribution, beam diameter, beam divergence distribution, BPP, beam profile (e.g., Gaussian, flat-top), beam shape, divergence, divergence profile, intensity distribution, luminance, $M^2$ factor, NA, optical intensity profile, optical mode (e.g., filtering), power density profile, radial beam position, radiance, spatial profile distribution, spot shape, spot size, or the like, or any combination thereof. In some examples, the one or mom beam characteristics of the optical beam can be modified the first length of fiber (block 3004), in the second length of fiber (block 3008), or in the first and second lengths of fiber (blocks 3004 and 3008).

In block 3006, the optical beam is coupled from the first length of fiber into a second length of fiber having a second RIP and two or more confinement regions. In some examples, the first RIP can be the same as or differ from the second RIP.

In block 3008, the one or more beam characteristics of the optical beam can be modified in the second length of fiber. Such modified beam characteristics can include, for example, azimuthal intensity distribution. In some examples, the one or more beam characteristics of the optical beam can be modified in the first length of fiber (block 3004), in the second length of fiber (block 3008), or in the first and second lengths of fiber (blocks 3004 and 3008).

In block 3010, the modified one or more beam characteristics of the optical beam are confined within the two or more confinement regions of the second length of fiber. In block 3012, an output beam, having the modified, one or more beam characteristics of the optical beam, is generated from the second length of fiber.

In some examples, the method can further comprise: adjusting an angular distribution of the output beam for ablating, cladding, cutting, drilling, engraving, glazing, heat-treating, marking, patterning, roughening, smoothing, surface texturing, trepanning, and/or welding one or more parts of a product. For example, the angular distribution can be adjusted to increase or decrease the divergence, to change the axis of symmetry, to make it symmetrical or asymmetrical, or to change the ratio of asymmetry.

In some examples, the method can further comprise: adjusting an azimuthal intensity distribution of the output beam for ablating, cladding, cutting, drilling, engraving, glazing, heat-treating, marking, patterning, roughening, smoothing, surface texturing, trepanning, and/or welding one or more parts of a product. For example, the azimuthal intensity distribution can be adjusted to make it symmetrical or asymmetrical, or to change the ratio of asymmetry.

In some examples, the method can further comprise: adjusting a beam diameter of the output beam for ablating, cladding, cutting, drilling, engraving, glazing, heat-treating, marking, patterning, roughening, smoothing, surface texturing, trepanning, and/or welding one or more parts of a product. For example, the beam diameter can be greater than or equal to 1 µm and less than or equal to 1,000 µm; greater than or equal to 1 µm and less than or equal to 100 µm (e.g., for additive manufacturing); greater than or equal to 100 µm and less than or equal to 500 µm (e.g., for welding): or greater than or equal to 500 µm and less than of equal to 1,000 µm (e.g., for cladding).

In some examples, the method can further comprise: adjusting a beam divergence distribution of the output beam for ablating, cladding, cutting, drilling, engraving, glazing, heat-treating, marking, patterning, roughening, smoothing, surface texturing, trepanning, and/or welding one or more parts of a product. For example, the beam divergence distribution can be adjusted to make it symmetrical or asymmetrical, In some examples, the method can further comprise: adjusting a BPP of the output beam for ablating, cladding, cutting, drilling, engraving, glazing, heat-treating, marking, patterning, roughening, smoothing, surface texturing, trepanning, and/or welding one or more pads of a product. For example, the BPP can be greater than or equal to 1 mm-mrad and less than or equal to 50 mm-mrad; greater than or equal to 1 mm-mrad and less than or equal to 10 mm-mrad; or greater than or equal to 10 mm-mrad and less than or equal to 50 mm-mrad.

In some examples, the method can further comprise: adjusting a beam profile (e.g., Gaussian, flat-top) of the output beam for ablating, cladding, cutting, drilling, engraving, glazing, heat-treating, marking, patterning, roughening, smoothing, surface texturing, trepanning, and/or welding one or more parts of a product. For example, the beam profile can be adjusted to make it Gaussian or more Gaussian, flat-topped or more flat-topped, ring/donut shaped, or an azimuthally non-symmetric, power distribution profile.

In some examples, the method can further comprise: adjusting a beam shape of the output beam for ablating, cladding, cutting, drilling, engraving, glazing, heat-treating, marking, patterning, roughening, smoothing, surface texturing, trepanning, and/or welding one or more parts of a product. For example, the beam shape can be adjusted to make it symmetrical or asymmetrical.

In some examples, the method can further comprise; adjusting a divergence of the output beam for ablating, cladding, cutting, drilling, engraving, glazing, heat-treating, marking, patterning, roughening, smoothing, surface texturing, trepanning, and/or welding one or more parts of a product. For example, the divergence can be greater than or equal to 10 mrad and less than or equal to 500 mrad; greater than or equal to 10 mrad and less than or equal to 200 mrad (e.g., glass-guided optical beam); greater than or equal to 50 mrad and less than or equal to 200 mrad (e.g., glass-guided optical beam); or greater than or equal to 50 mrad and less than or equal to 500 mrad (e.g., glass- or polymer-guided optical beam).

In some examples, the method can further comprise: adjusting a divergent e profile of the output beam for ablating, cladding, cutting, drilling, engraving, glazing, heat-treating, marking, patterning, roughening, smoothing, surface texturing, trepanning, and/or welding one or more parts of a product. For example, the divergence profile can be adjusted to make symmetrical or asymmetrical.

In some examples, the method can further comprise: adjusting an intensity distribution of the output beam for ablating, cladding, cutting, drilling, engraving, glazing, heat-treating, marking, patterning, roughening, smoothing, surface texturing, trepanning, and/or welding one or more parts of a product. For example, the intensity distribution can be adjusted to make it symmetrical or asymmetrical.

In some examples, the method can further comprise: adjusting a luminance of the output beam for ablating, cladding, cutting, drilling, engraving, glazing, heat-treating, marking, patterning, roughening, smoothing, surface texturing, trepanning, and/or welding one or more parts of a product.

In some examples, the method can further comprise: adjusting an $M^2$ factor of the output beam for ablating, cladding, cutting, drilling, engraving, glazing, heat-treating, marking, patterning, roughening, smoothing, surface texturing, trepanning, and/or welding one or more parts of a product. For example, the $M^2$ factor can be greater than or equal to 1 and less than or equal to 100; greater than or equal to 1 and less than or equal to 10; greater than or equal to 3 and less than or equal to 30; greater than or equal to 4 and less than or equal to 20; or greater than or equal to 5 and less than or equal to 100.

In some examples, the method can further comprise: adjusting an NA of the output beam for ablating, cladding, cutting, drilling, engraving, glazing, heat-treating, marking, patterning, roughening, smoothing, surface texturing, trepanning, and/or welding one or more parts of a product. For example, the NA can be greater than or equal to 0.01 and less than or equal to 0.50; greater than or equal to 0.05 and less than or equal to 0.25; greater than or equal to 0.01 and less than or equal to 0.20 (e.g., glass-guided optical beam); greater than or equal to 0.05 and less than or equal to 0.20 (e.g., glass-guided optical beam); or greater than or equal to 0.05 and less than or equal to 0.50 (e.g., glass- or polymer-guided optical beam).

In some examples, the method can further comprise: adjusting an optical intensity profile of the output beam for ablating, cladding, cutting, drilling, engraving, glazing, heat-treating, marking, patterning, roughening, smoothing, surface texturing, trepanning, and/or welding one or more parts of a product. For example, the optical intensity profile can be adjusted to make to shift intensity toward or away from a center of the output beam.

In some examples, the method can further comprise: adjusting an optical mode (e.g., filtering) of the output beam for ablating, cladding, cutting, drilling, engraving, glazing, heat-treating, marking, patterning, roughening, smoothing, surface texturing, trepanning, and/or welding one or more parts of a product. For example, the optical mode can be adjusted to filter out higher order modes from the output beam, or to intentionally add higher order mode shapes.

In some examples, the method can further comprise: increasing power density of the output beam for ablating, cladding, cutting, drilling, engraving, glazing, marking, patterning, roughening, surface texturing, trepanning, and/or welding one or more parts of a product. In some examples, the method can further comprise: decreasing power density of the output beam for cutting, engraving, glazing, heat-treating, marking, patterning, smoothing, surface texturing, and/or trepanning one or more parts of the product.

In some examples, the method can further comprise: adjusting a radial beam position of the output beam for ablating, cladding, cutting, drilling, engraving, glazing, heat-treating, marking, patterning, roughening, smoothing, surface texturing, trepanning, and/or welding one or more parts of a product. For example, the radial beam position can be closer to a center of a process fiber or farther from the center of the process fiber.

In some examples, the method can further comprise: adjusting a radiance of the output beam for ablating, cladding, cutting, drilling, engraving, glazing, heat-treating, marking, patterning, roughening, smoothing, surface texturing, trepanning, and/or welding one or more parts of a product.

In some examples, the method can further comprise: adjusting a spatial profile distribution of the output beam for ablating, cladding, cutting, drilling, engraving, glazing, heat-treating, marking, patterning, roughening, smoothing, surface texturing, trepanning, and/or welding one or more parts of a product. For example, the spatial profile distribution can be adjusted to make it symmetrical or asymmetrical.

In some examples, the method can further comprise: increasing beam diameter and/or spot size of the output beam for heat-treating and/or smoothing one or more parts of a product. A larger beam diameter and/or spot size can optimize build rate by covering more area during a given period of time, while a smaller beam diameter and/or spot size can improve the quality of an edge or surface qualities of a product being manufactured. Such improvements can drastically enhance build rate and/or feature resolution of the product.

The spot shape can vary, depending on intended use. For example, the spot shape can be round, elliptical, donut shaped, or any combination thereof (e.g., a round portion in the center surrounded by a donut shape). For example, the spot shape can be azimuthally symmetric or azimuthally asymmetric.

Figure 31:
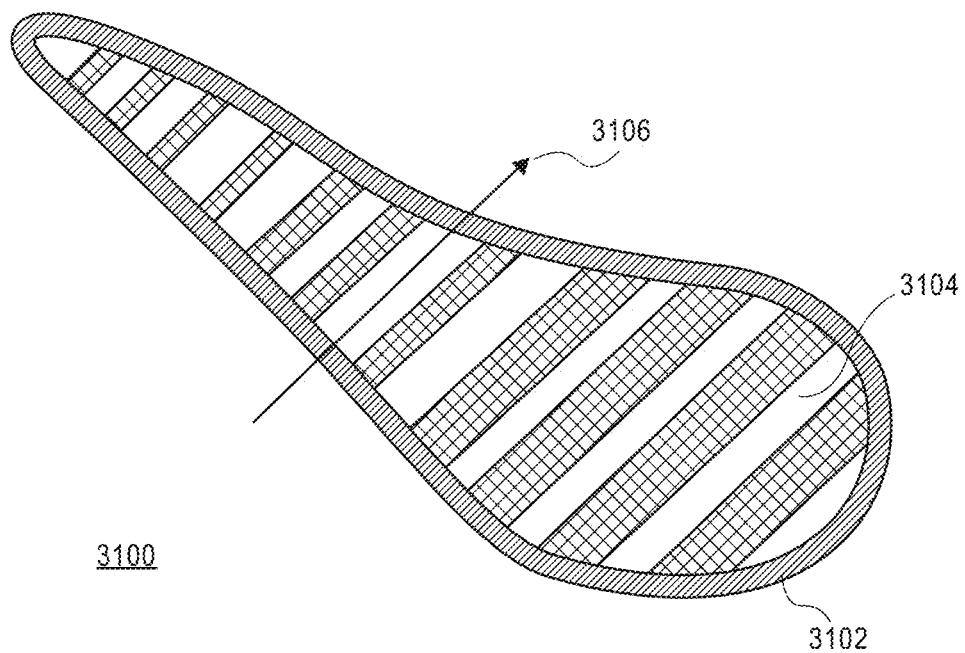
FIG. 31 depicts a plan view of a build layer having first and second regions.

FIG. 31 depicts a plan view of a build layer 3100 having a first region 3102 and a second region 3104. A scan direction 3106 provides an example path of an optical beam as it travels across the build layer 3100. While only a single pass of the optical beam is illustrated, multiple passes can be made across all or a portion of the build layer 3100, as desired, using almost any combination of scan directions to yield virtually any desired scan pattern. In addition, passes can be linear or non-linear, as desired. For optimum flexibility, one or more beam characteristics of the optical beam can be modified prior to and/or during any given pass.

As the optical beam travels across the build layer 3100, it initially encounters first region 3102, in which it can be desired to optimize surface roughness. A smaller beam diameter and/or spot size can be selected, for example, automatically or by an operator, to improve the quality of the surface finish in order to optimize surface roughness in first region 3102. As the optical beam continues across the build layer 3100, it encounters second region 3104, in which it can be desired to optimize build rate. A larger beam diameter and/or spot size can be selected, for example, automatically or by an operator, to optimize build rate by covering more area during a given period of time in second region 3104. As the optical beam continues across the build layer 3100, it again encounters first region 3102, in which it can be desired to optimize surface roughness. Once again, a smaller beam diameter and/or spot size can be selected, for example, automatically or by an operator, to improve the quality of the surface finish in order to optimize surface roughness in first region 3102.

At some point during the creation of a layer-based 3D object, every portion of the material for the 3D object is either exposed or lies immediately under the surface of a thinly deposited or processed layer, which is often referred to as a "build layer" in the additive manufacturing art. This level of access to the material for the 3D object of the build layer allows for additional processing by an optical (e.g., laser) beam.

Initially, a first layer of particles is positioned on a build plate. The particles can be free-flowing (e.g., a dry powder), in the form of a paste or wire (e.g., solid particles), or in any other form suitable for additive manufacturing. The particles can comprise metal materials, non-metal materials, or mixtures of both. Particles composing metal materials can include any metals or metal-containing compounds, including alloys and mixtures of various metallic compounds (e.g., metal oxides, metal carbides, metal nitrides, etc.) that are suitable for additive manufacturing. Non-metals can include any non-metal materials suitable for additive manufacturing, such as, for example, ceramics, polymers, or waxes.

The first layer of particles is heated by an optical beam sufficiently to fuse the particles together to form a first build layer. The optical beam employed for exposing the first build layer is emitted from an optical fiber, such as from any of the lasers disclosed in this application. One or more beam characteristics of the optical beam can be modified prior to and/or during the exposing of the first build layer. As disclosed in this application, the modifying of the optical beam occurs prior to the optical beam being outputted from the optical fiber.

After forming the first build layer, a second layer of particles is positioned on the exposed first build layer. The second layer of particles is heated by the optical beam sufficiently to fuse the particles together to form a second build layer. The optical beam employed for exposing the second build layer is emitted from the optical fiber, such as from any of the lasers disclosed in this application. One or more beam characteristics of the optical beam can be modified prior to and/or during the exposing of the second build layer. As disclosed in this application, the modifying or the optical beam occurs prior to the optical beam being outputted from the optical fiber.

The positioning of another layer of particles and subsequent heating of the another layer of particles can be repeated as necessary to form the 3D object.

The modifying of the one or more beam characteristics of the optical beam in the first length of fiber, in the second length of fiber, or in the first and second lengths of fiber can be performed by any of the techniques disclosed this application. For example, the modifying of the one or more beam characteristics can comprise modifying one or more of angular distribution, azimuthal intensity distribution, beam diameter, beam divergence distribution, BPP, beam profile (e.g., Gaussian, flat-top), beam shape, divergence, divergence profile, intensity distribution, luminance, $M^2$ factor, NA, optical intensity profile, optical mode (e.g., filtering), power density profile, radial beam position, radiance, spatial profile distribution, spot shape, spot size, or the like, or any combination thereof.

In some examples, the modifying of the one or more beam characteristics is carried out without the use of tree-space optics, disclosed in this application. Without such free-space optics, the resulting ability to quickly modify the one or more beam characteristics of the optical beam can allow, for example, switching among beam shapes on the fly (e.g., without slowing or stopping a pass of the optical beam), thereby providing corresponding manufacturing efficiencies, and allowing efficient tailoring of temperature profiles and the resulting stress states in a 3D object being manufactured. For example, free-space optics can allow such modifications over times on the order of hundreds of milliseconds, whereas in-fiber solutions could allow such modifications over times on the order of hundreds of microseconds or single-digit milliseconds.

In some examples, more than one laser can be used for the method of processing (e.g., a first laser for pre-heating powder, a second laser for fusing powder, and/or a third laser for post-heating powder). In particular, more than one laser with a variable BPP system as disclosed in this application could provide enhanced performance (e.g., improved part quality, part utility, and/or production speed) and/or increased flexibility (e.g., in process, machine, or plant design and/or operation).

In some examples, more than one laser can be used for the method of processing (e.g., stopping at points while a 3D object is being built using a first laser, and using a second laser to anneal, normalize, solutionize, stress relieve, temper, etc. the 3D object). In this example, the second laser could emit a larger, uniform beam and, thus, would not require the variable BPP system as disclosed in this application.

In some examples, the ability to quickly modify the one or mere beam characteristics of the optical beam, using a laser with a variable BPP system as disclosed in this application, would allow the same laser to be used for the entire method of processing, thereby providing corresponding manufacturing efficiencies.

Figure 32:
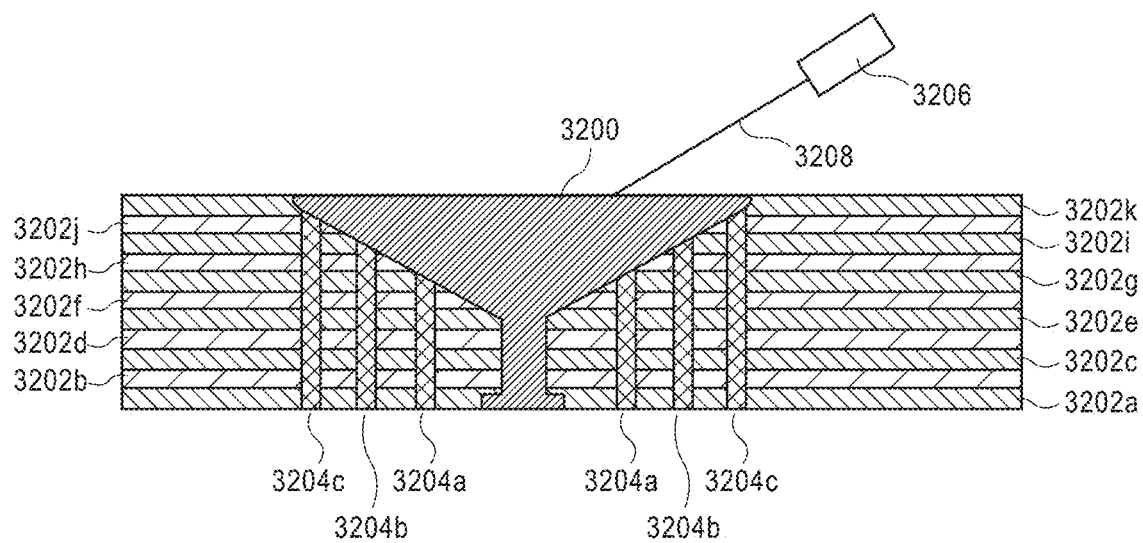
FIG. 32 depicts elevation view of a 3D object manufactured using a powder bed process.

FIG. 32 depicts elevation view of a 3D object 3200 manufactured using a powder bed process.

In some examples, the powder bed process can use one or more layers, such as first layer 3202a, second layer 3202b, third layer 3202c, fourth layer 3202d, fifth layer 3202e, sixth layer 3202f, seventh layer 3202g, eighth layer 3202h, ninth layer 3202i, tenth layer 3202j, and eleventh layer 3202k. However, any number of layers can be used. For example, the number of layers can be greater than or equal to 1 and less than or equal to 100,000; greater than or equal to 10 and less than or equal to 10,000; or be greater than or equal to 100 and less than or equal to 1,000.

Depending on the processing, the one or more layers (e.g., first layer 3202a, second layer 3202b, third layer 3202c, fourth layer 3202d, fifth layer 3202e, sixth layer 3202f, seventh layer 3202g, eighth layer 3202h, ninth layer 3202i, tenth layer 3202j, or eleventh layer 3202k, or any combination thereof) can comprise powder that is the same in each layer, different in each layer, the same in two or more layers, different in two or mere layers, the same in alternating layers, different in alternating layers, the same in bottom and top layers, etc.

When building a complex 3D object, such as 3D object 3200, supporting structures can be incorporated that stay in place until 3D object 3200 is completed (after which the supporting structures are removed). In some examples, the powder bed process can use one or more supporting structures, such as first supporting structures 3204a, second supporting structures 3204b, and third supporting structures 3204c. However, any number of supporting structures can be used. For example, the number of supporting structures can be greater than or equal to 1 and less than or equal to 1,000,000, but the number of supporting structures could exceed 1,000,000.

As shown in FIG. 32, optical beam source 3206 can generate optical beam 3208 to selectively heat the one or more layers (e.g., first layer 3202a, second layer 3202b, third layer 3202c, fourth layer 3202d, fifth layer 3202e, sixth layer 3202f, seventh layer 3202g, eighth layer 3202h, ninth layer 3202i, tenth layer 3202j, or eleventh layer 3202k, or any combination thereof) of powder sufficiently to fuse some of the particles together to form 3D object 3200, first supporting structures 3304a, second supporting structures 3204b, and/or third supporting structures 3204c.

Figure 33:
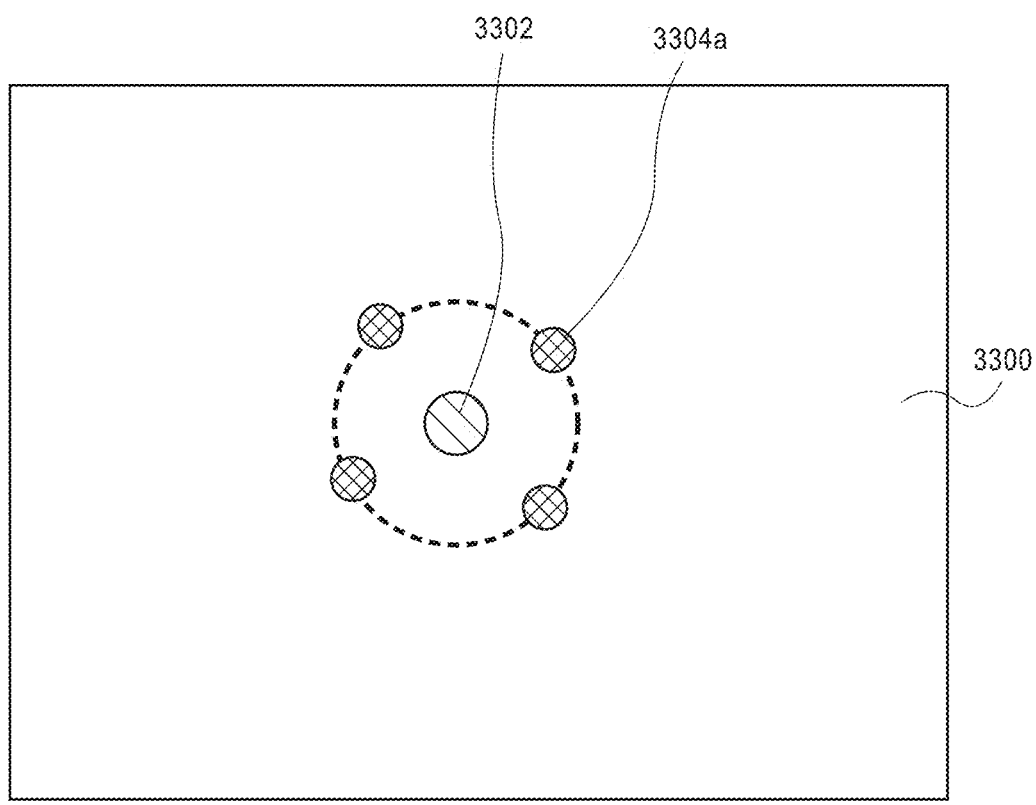
FIG. 33 depicts a plan view of a 3D object at a first point during the powder bed process.

FIG. 33 depicts a plan view of the 3D object 3200 at a first point during the powder bed process. The 3D object 3200 starts with a layer of particles 3300 forming a powder bed positioned on a build plate (not shown) so as to be exposed. The layer of particles 3300 is selectively heated by an optical beam sufficiently to fuse some of the particles together to form a first portion 3302 of 3D object 3200 and four first supporting structures 3304a. One or more beam characteristics of the optical beam can be modified prior to and/or during the selective heating of the layer of particles 3300 (different beam characteristics can be desired, for example, when forming a relatively permanent 3D object as opposed to a relatively temporary supporting structure).

The remaining particles in the layer of particles 3300 of the powder bed remain unfused. The positioning of another layer of particles and subsequent heating of the another layer of particles is repeated, continuing to build the first portion 3302 of 3D object 3200 and the four first supporting structures 3304a.

Figure 34:
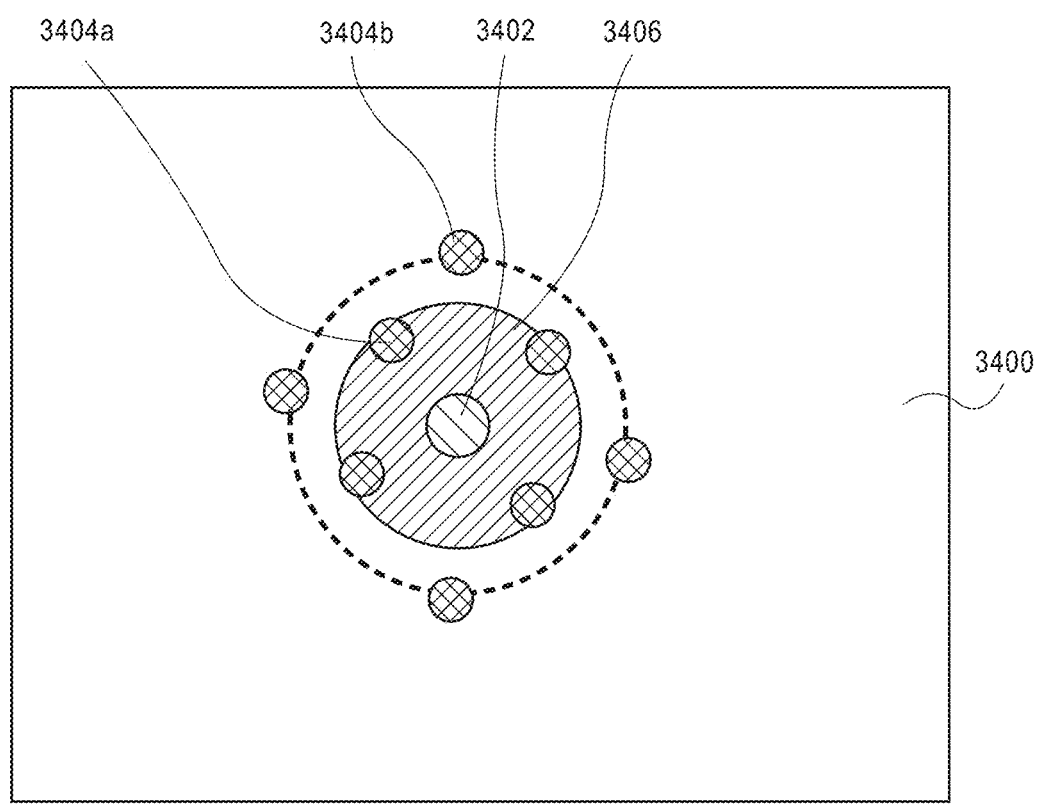
FIG. 34 depicts a plan view of a 3D object at a second point during the powder bed process.

FIG. 34 depicts a plan view of a 3D object at a second point during the powder bed process. A layer of particles 3400 is positioned on the previous layer so as to be exposed. The layer of particles 3400 is selectively heated by an optical beam sufficiently to fuse some of the particles together to form a first portion 3402 of 3D object 3200, a second portion 3406 of 3D object 3200, four first supporting structures 3404a, and four second supporting structures 3404b. One or more beam characteristics of the optical beam can be modified prior to and/or during the selective heating of the layer of particles 3400 (different beam characteristics can be desired, for example, when the material underlying a layer of particles is unfused powder as opposed to when the material underlying the layer of particles is a solid of fused material; different beam characteristics can be desired, for example, when forming a relatively permanent 3D object as opposed to a relatively temporary supporting structure).

The remaining particles in the layer of particles 3400 of the powder bed remain unfused. The positioning of another layer of particles and subsequent heating of the another layer of particles is repeated, continuing to build the first portion 3402 of 3D object 3200, the second portion 3406 of 3D object 3200, and the four second supporting structures 3404b (the four first supporting structures 3404a do not extend upward beyond the layer of particles 3400).

Figure 35:
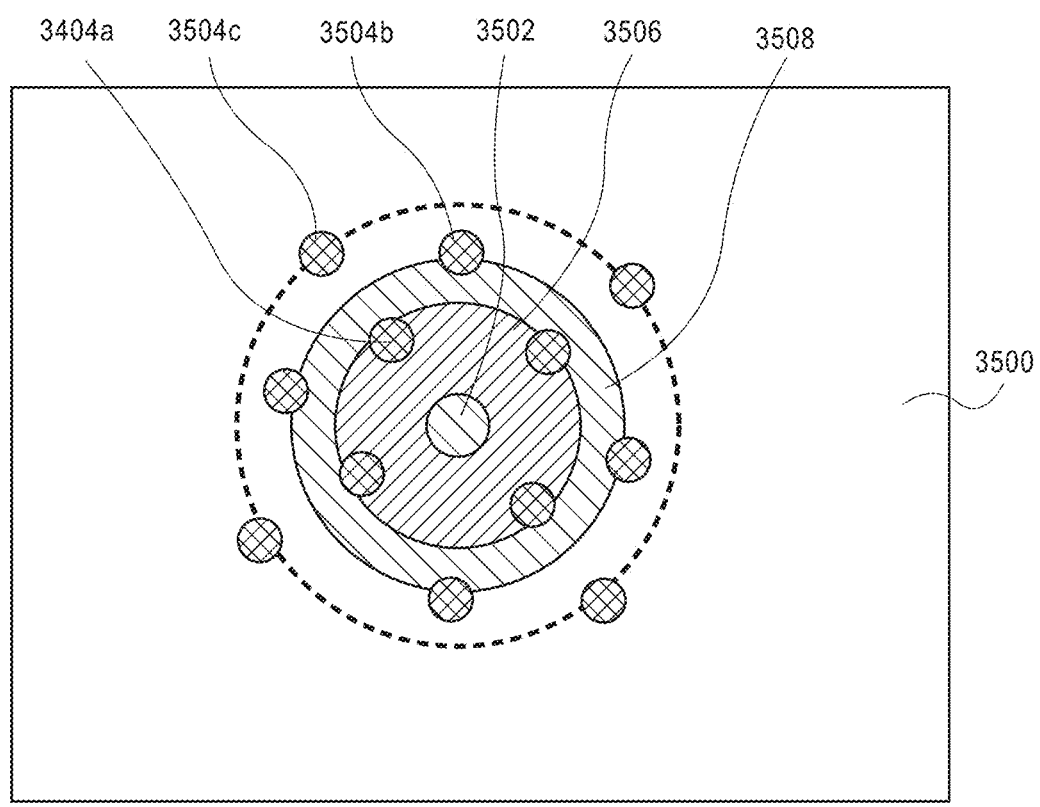
FIG. 35 depicts a plan view of a 3D object at a third point during the powder bed process.

FIG. 35 depicts a plan view of a 3D object at a third point during the powder bed process. A layer of particles 3500 is positioned on the previous layer so as to be exposed. The layer of particles 3500 is selectively heated by an optical beam sufficiently to fuse some of the particles together to form a first portion 3502 of 3D object 3200, a second portion 3506 of 3D object 3200, a third portion 3508 of 3D object 3200, four second supporting structures 3504b, and four third supporting structures 3504c (the four first supporting structures 3404a did not extend upward beyond the layer of particles 3400, but are shown for clarity). One or more beam characteristics of the optical beam can be modified prior to and/or during the selective heating of the layer of particles 3500 (different beam characteristics can be desired, for example, when the material underlying a layer of particles is unfused powder as opposed to when the material underlying the layer of particles is a solid of fused material; different beam characteristics can be desired, for example, when forming a relatively permanent 3D object as opposed to a relatively temporary supporting structure).

The remaining particles in the layer of particles 3500 of the powder bed remain unfused. The positioning of another layer of particles and subsequent heating of the another layer of particles is repeated, continuing to build the first portion 3502 of 3D object 3200, the second portion 3506 of 3D object 3200, the third portion 3508 at 3D object 3200, and the four third supporting structures 3504c (the four second supporting structures 3504b do not extend upward beyond the layer of particles 3500).

Figure 36:
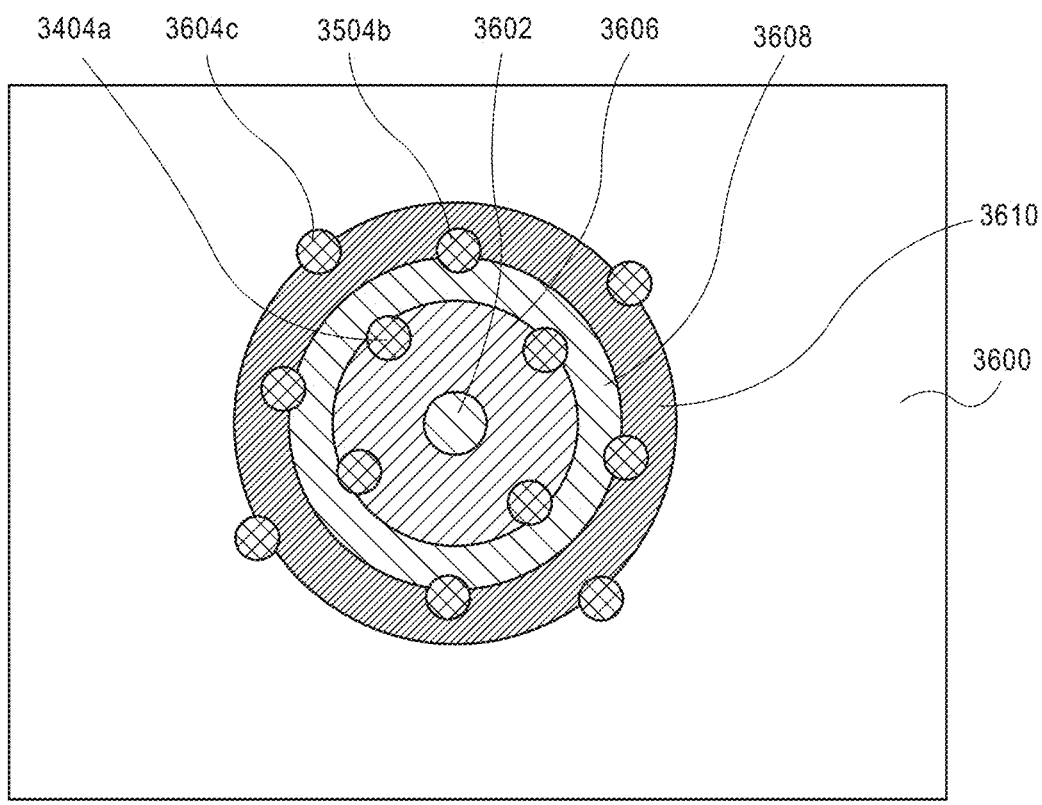
FIG. 36 depicts a plan view of a 3D object at a fourth point during the powder bed process.

FIG. 36 depicts a plan view of a 3D object at a fourth point during the powder bed process. A layer of particles 3600 is positioned on the previous layer so as to be exposed. The layer of particles 3600 is selectively heated by an optical beam sufficiently to fuse some of the particles together to form a first portion 3602 of 3D object 3200, a second portion 3606 of 3D object 3200, a third portion 3608 of 3D object 3200, a fourth portion 3610 of 3D object 3200, and four third supporting structures 3604c (the four first supporting structures 3404a did not extend upward beyond the layer of particles 3400 and the four second supporting structures 3504b did not extend upward beyond the layer of particles 3500, but are shown for clarity). One or more beam characteristics of the optical beam can be modified prior to and/or during the selective heating of the layer of particles 3600 (different beam characteristics can be desired, for example, when the material underlying a layer of particles is unfused powder as opposed to when the material underlying the layer of particles is a solid of fused material; different beam characteristics can be desired, for example, when forming a relatively permanent 3D object as opposed to a relatively temporary supporting structure).

The remaining particles in the layer particles 3600 of the powder bed remain unfused. The positioning of another layer of particles and subsequent heating of the another layer of particles are not repeated, because 3D object 3200 is now complete.

In some examples, the method can further comprise: using the output beam for ablating, cladding, cutting, drilling, engraving, glazing, heat-treating, marking, patterning, roughening, smoothing, surface texturing, trepanning, and/or welding one or more parts of a product. The using of the output beam can occur, for example, during and/or after manufacture of the product.

Figure 37:
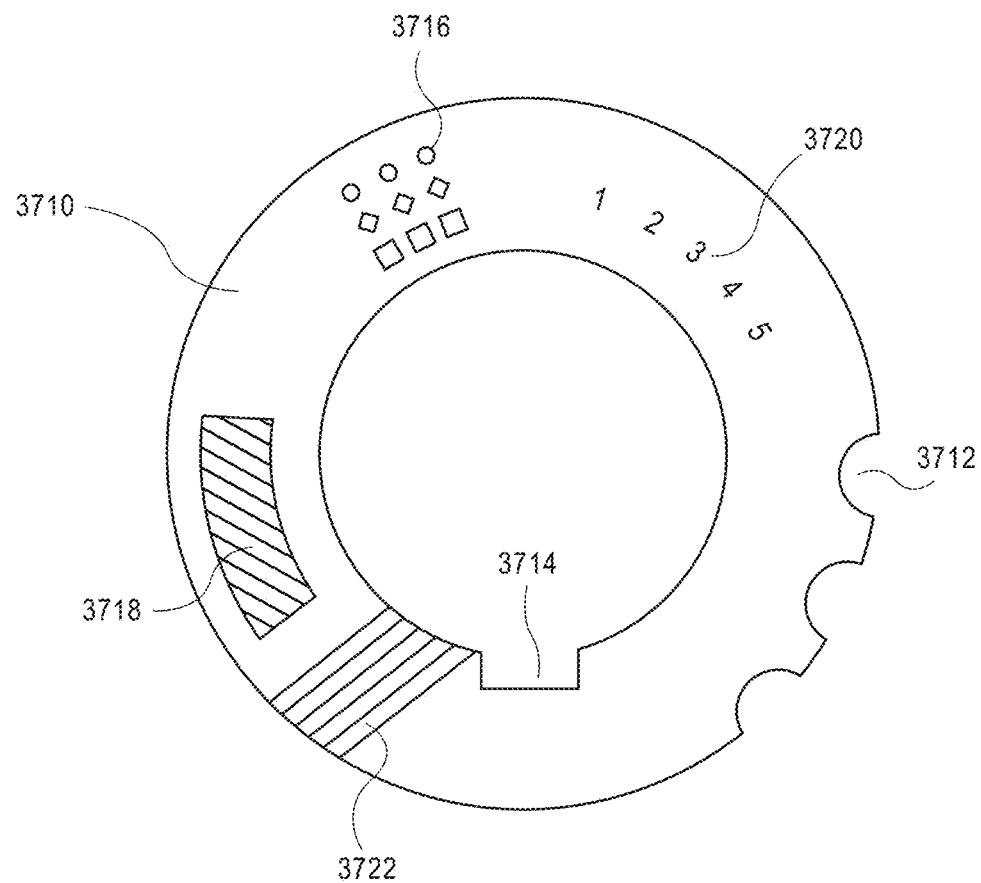
FIG. 37 depicts a plan view of a portion of a 3D object after fusing.

FIG. 37 depicts a plan view of a portion of a 3D object after fusing. Portion 3710 of 3D object 3200 can be a product for which further processing is desired or required. Such further processing can include, for example, one or more of ablating and/or engraving 3712; cutting 3714; drifting and/or trepanning 3716; heat-treating 3718: marking 3720; or engraving, patterning, roughening, and/or surface texturing 3722, or any combination thereof.

Figure 38A:
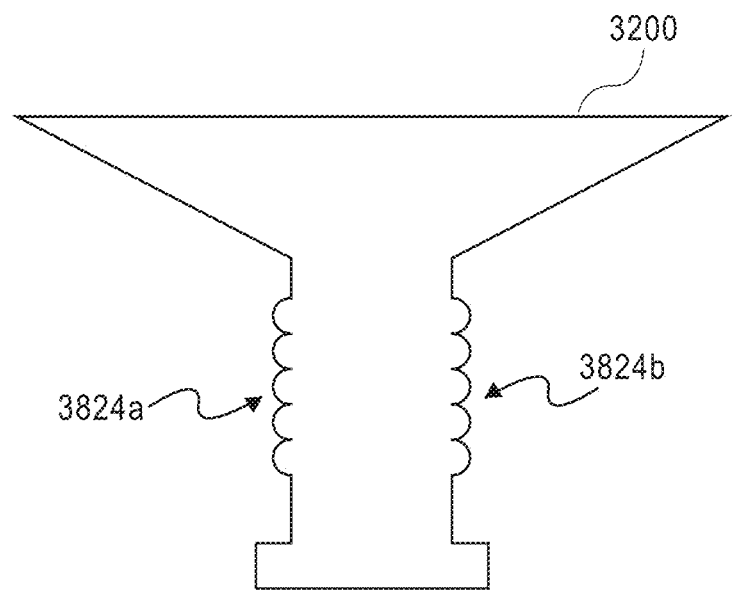
FIG. 38A depicts an elevation view of a 3D object after fusing.
Figure 38B:
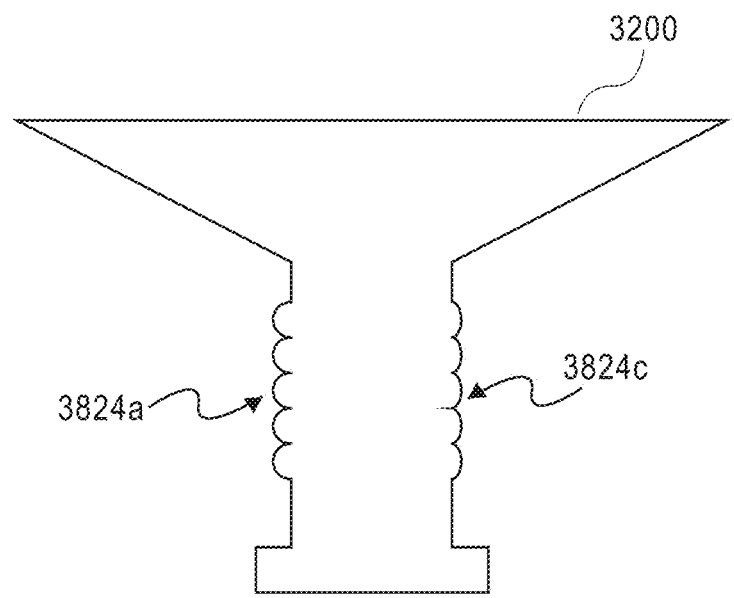
FIG. 38B depicts an elevation view of a 3D object after fusing and further processing.

FIG. 38A depicts an elevation view of a 3D object after fusing. 3D object 3200 can be a product for which further processing is desired or required, FIG. 38B depicts an elevation view of a 3D object after fusing and such further processing. The further processing can include, for example, one or more of gazing, smoothing, or a combination thereof. As deposited or as deposited and fused, 3D object 3200 can have portions 3824a, 3824b that include significant irregularities. As understood by a PHOSITA, one or more of glazing, smoothing, or a combination thereof can reduce the irregularities, for example, of portion 3824b to that of portion 3824c or similar.

During operations that remove material (e.g., ablating, cutting, drilling, engraving, trepanning), laser cutting speed (e.g., material feed rate) and/or laser output power can affect kerf width. Generally, kerf width increases for lower cutting speeds and higher laser powers.

Also, during operations that remove material (e.g., ablating, cutting. drilling, engraving, trepanning), high pressure assist gas can be used to prevent or limit oxidation reactions in the removal area, to evacuate melted material from the kerf, to add heat input to tile process, or to remove neat from the process. The assist gas and/or the pressure of the assist gas can be selected, for example, automatically or by an operator from one or more sources. The assist gas itself can include one or more of air, argon, helium, nitrogen, oxygen, other gases known to a person having ordinary skill in the art, or any combination thereof.

Depending on the processing, values of the assist gas pressure can range, for example, from less than 1 pound per square inch gauge ("psig") to more than 500 psig; greater than or equal to 1 psig and less than or equal to 10 psig; greater than or equal to 1 psig and less than or equal to 50 psig; or greater than or equal to 50 psig and less than or equal to 500 psig. The pressure can be constant during a given processing or can be changed at least once during the processing, such as when changing the assist gas, when modifying the one or more beam characteristics, and/or when starting or finishing any individual pass of a scan pattern.

In some examples, the method can further comprise: modulating the output beam while ablating, cladding, cutting, drilling, engraving, glazing, heat-treating, marking, patterning, roughening, smoothing, surface texturing, trepanning, and/or welding one or mom parts of a product. The modulating of the output beam can occur, for example, during and/or after manufacture of the product.

Modulating of the output beam can involve starting and stopping of generation of the output beam (e.g., effectively turning the output beam on and off). In some examples, the output beam can be generated as a series of pulses. A pulse indicates that the output beam is being generated (e.g., is on), and the absence of a pulse indicates that the output beam is not being generated (e.g., is off).

In some examples, the output beam can be modulated at a selected frequency (typically expressed in cycles/second or Hertz ("Hz"). The modulation frequency can be selected, for example, automatically or by an operator from on or more discrete values or from a continuous range of values.

Depending on the processing, values of the modulation frequency can be, for example, greater than or equal to 1 Hz and less than or equal to 100,000 Hz (100 kHz); greater than or equal to 1 Hz and less than or equal to 500 Hz; greater than or equal to 500 Hz and less than or equal to 5,000 Hz (5 kHz); or greater than or equal to 5,000 Hz (5 kHz) and less than or equal to 100,000 Hz (100 kHz). The modulation frequency can be constant during a given processing or can be changed at least once during the processing, such as when modifying the one or more beam characteristics and/or when starting or finishing any individual pass of a scan pattern.

In some examples, the output beam can be modulated at a selected duty cycle, where the duty cycle is the fraction of a period during which the output beam is on (typically expressed in percent). The duty cycle can influence heat input and/or the heating rate. The duty cycle can be selected, for example, automatically or by an operator from one or more discrete values or from a continuous range of values from 0% to 100%. Depending on the processing, values of the duty cycle can include, for example, 0% (always off); 10%; 20%; 25%; 30%; 40%; 50% (half on, half off); 60%; 70%; 75%; 80%; 90%; or 100% (always on). Values of the duty cycle also can include, for example, about 10%; about 20%; about 30%; about 40%; about 50%; about 60%; about 70%; about 80%; or about 90%. The duty cycle can be constant during a given processing or can be changed at least once during the processing, In some examples, the method can further comprise: in additive processing, alternately using the output beam to pre-heat powder prior to fusing the powder and using the output beam to fuse the powder.

In additive processing, it can be desirable to pre-heat and/or post-heat the associated powder, as well as to fuse the powder. In contrast to standard commercial AM systems the pre-heating can raise the temperature of the associated powder in a powder bed and/or an associated substrate above 200° C. (e.g., for control of moisture), above 500° C. (e.g., for control of residual stresses), or above 1,000° C. (e.g., or control of microstructure evolution). Such pre-heating can improve, for example, crack mitigation, distortion control, and/or microstructure control. The higher temperatures generally correlate with the processing of metals, while the lower temperatures generally correlate with the processing of polymers.

In such processing, the output beam can be used to pre-heat powder prior to fusing the powder, and also used to fuse the powder. The output beam can be alternated back and forth between pre-heating the powder and fusing the powder, being changed, for example, when modifying the one or more beam characteristics, during any individual pass of a scan pattern, and/or when starting or finishing any individual pass of the scan pattern.

In some examples, the method can further comprise: in additive processing, alternately using the output beam to pre-heat powder prior to fusing the powder and using the output beam to post-heat the fused powder.

As discussed above, in additive processing, it can be desirable to pre-heat and/or post-heat the associated powder, as well as to fuse the powder. The pre-heating can raise the temperature of the associated powder in a powder bed and/or an associated substrate above 100° C., above 300° C. (e.g., lower temperature melt alloys), or above 600° C. (higher temperature melt alloys). As before, the higher temperatures generally correlate with the processing of metals, while the lower temperatures generally correlate with the processing of polymers.

In such processing, the output beam can be used to pre-heat powder prior to fusing the powder, and also used to post-heat the fused powder. The output beam can be alternated back and forth between pre-heating the powder and post-heating the fused powder, being changed, for example, when modifying the one or more beam characteristics, during any individual pass of a scan pattern, and/or when starting or finishing any individual pass of the scan pattern.

In such processing, the post-heating of the fused powder can help control the cooldown rate of the fused powder, improving ductility, reducing residual stresses, and reducing the propensity for cracking at least in portions of the fused powder. In contrast, a lack of post-heating effectively can quench the fused powder, increasing stress and improving hardness at least in portions of the fused powder. Thus, the manner and amount of post-heating can be tailored to influence and/or control properties of the fused powder, in particular by modifying the one or more beam characteristics to provide fine tuning of the post-heating effects.

In some examples, the method can further comprise: in additive processing, alternately using the output beam to fuse powder and using the output beam to post-heat the fused powder.

As discussed above, in additive processing, it can be desirable to pre-heat and/or post-heat the associated powder, as well as to fuse the powder. In such processing, the output beam can be used to fuse the powder, and also used to post-heat the fused powder. The output beam can be alternated back and forth between fusing the powder and post-heating the fused powder, being changed, for example, when modifying the one or more beam characteristics, during any individual pass of a scan pattern, and/or when starting or finishing any individual pass of the scan pattern.

In some examples, the method can further comprise: in additive processing, alternately using the output beam to pre-heat powder prior to fusing the powder, using the output beam to fuse the powder, and using the output beam to post-heat the fused powder.

As discussed above, in additive processing, it can be desirable to pre-heat and/or post-heat the associated powder, as well as to fuse the powder. The pre-heating can raise the temperature of the associated powder in a powder bed and/or an associated substrate above 100° C., above 300° C. (e.g., lower temperature melt alloys), or above 600° C. (higher temperature melt alloys). As before, the higher temperatures generally correlate with the processing of metals, while the lower temperatures generally correlate with the processing of polymers.

In such processing, the output beam can be used to pre-heat powder prior to fusing the powder, to fuse the powder, and also used to post-heat the fused powder. The output beam can be alternated between pre-heating the powder, fusing the powder, and post-heating the fused powder, being changed, for example, when modifying the one or more beam characteristics, during any individual pass of a scan pattern, and/or when starting or finishing any individual pass of the scan pattern.

In some examples, the method can further comprise: in additive processing, using a first portion of the output beam to pre-heat powder prior to fusing the powder, and simultaneously using a second portion of the output beam to fuse the powder. In some examples, the method can further comprise: in additive processing, using a first portion of the output beam to fuse powder, and simultaneously using a second portion of the output beam to post-heat the fused powder. In some examples, the method can further comprise: in additive processing, using a first portion of the output beam to pre-heat powder prior to fusing the powder, and simultaneously using the first portion of the output beam to post-heat the fused powder. In some examples, the method can further comprise: in additive processing, using a first portion of the output beam to pre-heat powder prior to fusing the powder, simultaneously using a second portion of the output beam to fuse the powder, and simultaneously using the first portion of the output beam to post-heat the fused powder.

The variable BPP system as disclosed in this application can split the optical beam into two or more portions. For example, the variable BPP system can split the optical beam into a relatively small, higher power density central spot and a relatively large, lower power density ring surrounding the central spot. In this case, as the optical beam passes over a powder bed, the surrounding ring can pre-heat the powder bed, then the central spot can fuse the powder, and finally the surrounding ring can post-heat the fused powder.

In addition, the variable BPP system as disclosed in this application can split the optical beam into other examples of two or more portions, as would be understood by a person having ordinary skill in the art. These other examples provide various combinations of pre-heating the powder bed, fusing the powder, and/or post-heating the fused powder.

When splitting the optical beam into two or more portions, the modifying of the one or more beam characteristics includes modifying one or more beam characteristics of at least one of the two or more portions.

In some examples, a method of processing by controlling one or more beam characteristics of an optical beam can comprise: launching the optical beam into a first length of fiber having a first RIP; coupling the optical beam from the first length of fiber into a second length of fiber having a second RIP and two or more confinement regions; modifying the one or more beam characteristics of the optical beam in the first length of fiber, in the second length of fiber, or in the first and second lengths of fiber; confining the modified one or more beam characteristics of the optical beam within the two or more confinement regions of the second length of fiber; and/or generating an output beam, having the modified one or more beam characteristics of the optical beam, from the second length of fiber. The first RIP can be the same as the second RIP.

Having described and illustrated the general and specific principles of examples of the presently disclosed technology, it should be apparent that the examples may be modified in arrangement and detail without departing from such principles. We claim all modifications and variation coming within the spirit and scope of the following claims.

The invention claimed is:

1. An apparatus, comprising:
   an optical fiber usable in an optical beam delivery system, the optical fiber including:
   a confinement region having a refractive index arranged to maintain any selected beam characteristic from a set of two or more different beam characteristics; and
   a perturbation region to, in accordance with the selected beam characteristic of the set of two or more different beam characteristics, modify one or more beam characteristics of an optical beam by a perturbation assembly coupled to the perturbation region or integral with the perturbation region;
   wherein the confinement region preserves at least a portion of the one or more beam characteristics of the optical beam modified by the perturbation assembly; and
   wherein the perturbation assembly is selectively operable in a group of modes including: a first mode of operation that corresponds to a first beam characteristic of the set of two or more different beam characteristics and in which the optical beam modified by the perturbation assembly is arranged for generating a laser beam having a spot shaped beam profile, and a second different mode of operation that corresponds to a second different beam characteristic of the set of two or more different beam characteristics and in which an intensity distribution of the laser beam is moved radially outward relative to the first mode of operation.

2. The apparatus of claim 1, further comprising circuitry to control the perturbation assembly to laser-process a workpiece using one of the first and second modes at a first time, and using the other of the first and second modes at a second time that is after the first time.

3. The apparatus of claim 1, wherein the confinement region is arranged to trap an intensity distribution of the modified optical beam in a part of the confinement region that is displaced from a center of the optical fiber.

4. The apparatus of claim 1, wherein the confinement region includes two or more confinement regions, and wherein the part of the confinement region comprises a confinement region around another confinement region of the two or more confinement regions.

5. The apparatus of claim 4, wherein the confinement region around the other confinement region of the two or more confinement region comprises an outermost confinement region.

6. The apparatus of claim 1, wherein the perturbation assembly is powered by, or comprises, a power source and the apparatus further comprises circuitry arranged to identify a beam perturbation device drive level in accordance with a selected mode of the group of modes, the beam perturbation device drive level arranged to tune the delivery of the laser beam to the workpiece;
   wherein the perturbation assembly is situated to select a bend of at least a section of the perturbation region to perturb the optical beam and produce the modified optical beam, in response to operating based on the identified beam perturbation device drive level; and
   wherein the confinement region is situated to receive the modified optical beam.

7. The apparatus of claim 6, wherein the confinement region includes a refractive index profile selected to maintain at least one beam characteristic of the modified optical beam.

8. The apparatus of claim 7, wherein the refractive index profile comprises a graded-index.

9. The apparatus of claim 6, wherein the perturbation assembly comprises a general purpose microprocessor or an application specific integrated circuit and the apparatus further comprises:
   a memory storing a calibration table in which the two or more different beam characteristics are correlated with two or more different fiber perturbation values, respectively,
   wherein the perturbation assembly is further configured to:
   receive information about a demanded laser attribute for the tuning the delivery of the laser beam to the workpiece; and
   perform a look-up from the calibration table based on the information about the demanded laser attribute, wherein the beam perturbation device drive level is identified based on the looked-up from the calibration table.

10. The apparatus of claim 6, wherein the perturbation assembly comprises:
    means for displacing a core of the optical fiber from a fiber axis.

11. An apparatus, comprising:
an optical fiber device usable in an optical beam delivery system, the optical fiber device including:
a perturbation region situated to receive an input optical beam, the perturbation region having a first refractive index profile;
a perturbation assembly coupled to the perturbation region or integral with the perturbation region;
a confinement region having a second refractive index profile arranged to maintain any selected beam characteristic from a set of two or more different beam characteristics; and
means for variably controlling delivery of a laser to a workpiece, the variable controlling means arranged to generate, in accordance with the selected beam characteristic of the set of two or more different beam characteristics, a control signal to send to the perturbation assembly, wherein the control signal is based on information about a demanded laser attribute for the delivery of the laser to the workpiece;
wherein the confinement region is situated to receive a modified optical beam generated by operation of the perturbation assembly based on the generated control signal, and the second refractive index profile preserves at least one beam characteristic of the modified optical beam.

12. The apparatus of claim 11, wherein a section of the perturbation region extends from a fiber support.

13. The apparatus of claim 11, wherein a section of the perturbation region is situated between a first fiber support and a second fiber support.

14. The apparatus of claim 11, wherein the first refractive index profile comprises a graded-index.

15. The apparatus of claim 11, wherein the power source comprises an electrical voltage source.

16. The apparatus of claim 11, wherein the perturbation assembly comprises:
means for displacing a core of the optical fiber from a fiber axis.

17. The apparatus of claim 11, wherein the perturbation assembly comprises a general purpose microprocessor or an application specific integrated circuit, wherein the apparatus further comprises:
a memory storing a calibration table in which the two or more different beam characteristics are correlated with two or more different fiber perturbation values, respectively,
wherein the variably controlling means is further configured to:
receive information about the demanded laser attribute for the delivery of the laser to the workpiece; and
look-up one of the fiber perturbation values from the calibration table based on the information about the demanded laser attribute, wherein the control signal is generated based on the looked-up one of the fiber perturbation values.

18. The apparatus of claim 17, wherein the general purpose microprocessor is configured to execute instructions stored in the memory or another memory, the instructions for generating the control signal.

* * * * *